United States Patent [19]

Beranger et al.

[11] Patent Number: 5,296,802
[45] Date of Patent: Mar. 22, 1994

[54] CURRENT SENSOR USING A RESONANCE DIRECTIONAL MAGNETOMETER

[75] Inventors: Marc Beranger, Meylan; Denis Duret, Grenoble, both of France

[73] Assignee: Commissariat a l'Energie Atomique, Paris, France

[21] Appl. No.: 894,540

[22] Filed: Jun. 5, 1992

[30] Foreign Application Priority Data

Jun. 18, 1991 [FR] France ............................ 9107445

[51] Int. Cl.[5] .......................... G01R 33/20; G01V 3/00
[52] U.S. Cl. .................................. 324/117 R; 324/300
[58] Field of Search ................... 324/117 R, 127, 225, 324/320, 300

[56] References Cited

U.S. PATENT DOCUMENTS

| | | | |
|---|---|---|---|
| 2,845,595 | 7/1958 | Leete | 324/117 R |
| 3,128,425 | 4/1964 | Codrington . | |
| 3,573,616 | 4/1971 | Kahen . | |
| 4,114,087 | 9/1978 | Fry . | |
| 4,876,503 | 10/1989 | Aubert | 324/117 R |

FOREIGN PATENT DOCUMENTS 0359598  3/1990 European Pat. Off. .
0463919  1/1992 European Pat. Off. .

OTHER PUBLICATIONS

Soviet Journal of Instrumentation and Control, No. 12, pp. 3–5, Dec. 1968, L. K. Dondoshanskii, et al., "Instruments and Automatic Control Equipment".
VDI Zeitschrift, vol. 115, No. 13, pp. 1038–1039, Sep. 1973.

Primary Examiner—Ernest F. Karlsen
Attorney, Agent, or Firm—Oblon, Spivak, McClelland, Maier & Neustadt

[57] ABSTRACT

A current sensor using a resonance directional magnetometer which includes a magnetic circuit having a gap and a device supplying a voltage representative of a magnetic field produced in the gap by a current when the current passes through the circuit. The value of the field is a function of the intensity of the current. The device is a resonance directional magnetometer having a sample with resonant spins placed in the gap and exposed to a magnetic field having a polarization parallel to the field produced in the gap or coinciding with this field and a measuring device for exciting the resonance and detecting the excited resonance and for supplying a voltage representative of the amount of excited resonance.

16 Claims, 16 Drawing Sheets

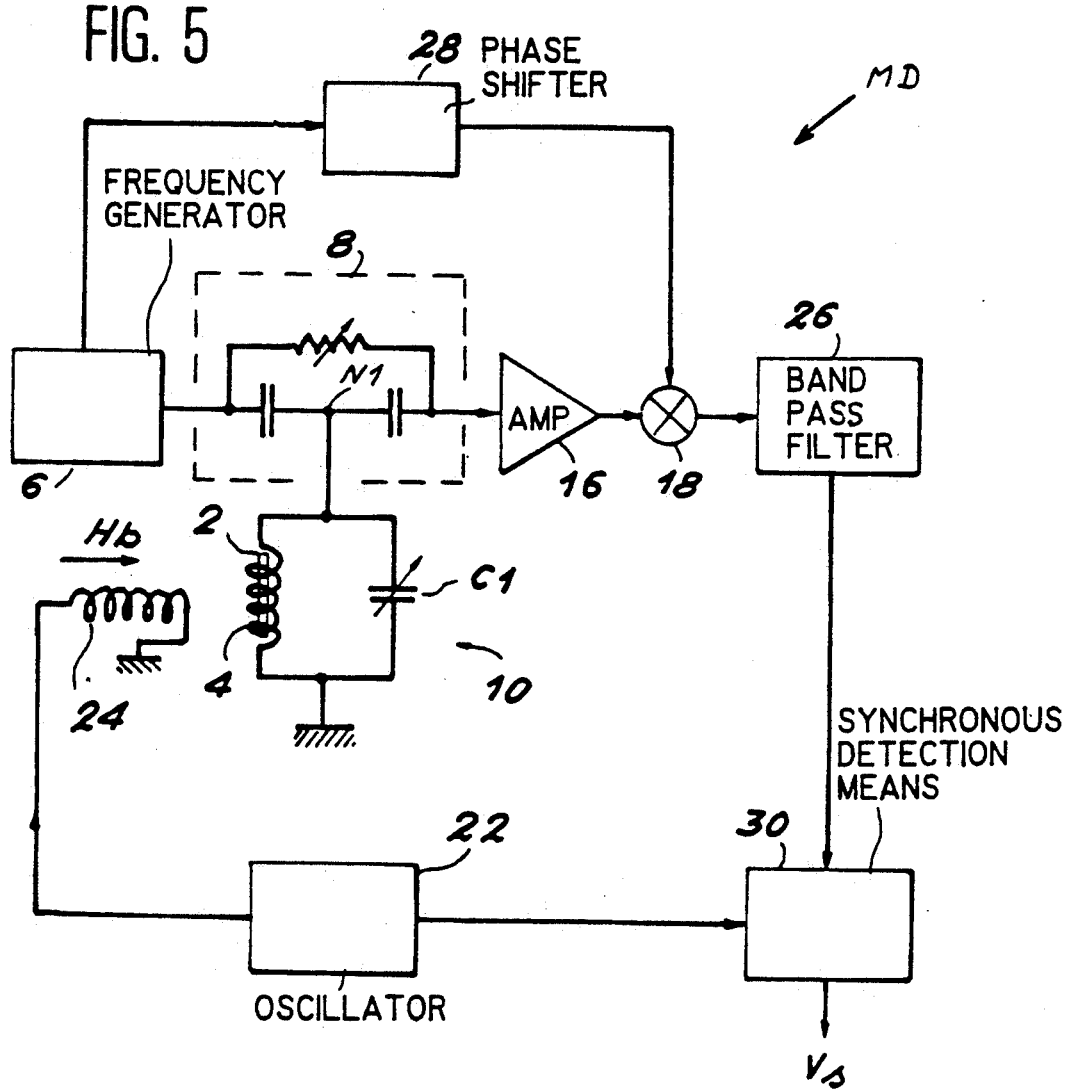
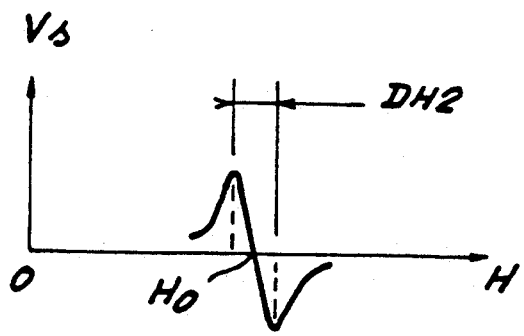

CURRENT SENSOR USING A RESONANCE DIRECTIONAL MAGNETOMETER

BACKGROUND OF THE INVENTION

1. Field of the Invention

The present invention relates to a current sensor having a magnetic circuit with a gap and a measuring device able to supply a voltage representative of a magnetic field Hlex produced in the gap by a current, when the latter passes through the magnetic circuit and whose value is a function of the intensity of said current.

The intensity of the current can be constant in time or can be an alternating current, whose frequency does not exceed approximately $10^5$Hz. Moreover, the current can be transported by an electrical conductor or can be the current of a beam of electrically charged particles.

The invention more particularly applies to the measurement of low electrical intensities, e.g. a few dozen mA.

2. Discussion of the Background

Documents (1) "The grip current tester E1", Chauvin Arnoux, Electronique Radio Plans 520, pp.19 to 21, 1991 and (2) Electro PJP, "Technical report of the designer", pp. 1 to 9 disclose current sensors having a magnetic circuit with a gap, together with a magnetic sensor constituted by a Hall effect sensor or probe placed in the gap. When an electric current passes through the magnetic circuit, a magnetic field is produced in the gap and said field is proportional to the intensity of the current and inversely proportional to the length of the gap.

In connection with Hall effect sensors reference can be made to document (3) "Hall effect devices", R.S. Popovic, Sensors and Actuators, 17,1989, pp. 39 to 53.

Other sensors using the Hall effect are known from documents (4) FR-A-2,584,195 (Chauvin-Arnoux) and (5) EP-A-194,225 (LEM SA).

Current sensors using the Hall effect suffer from disadvantages and in particular a low resolution of approximately 1 microtesla, an offset during a measurement of approximately 1 mT, they have a noise which is inversely proportional to the frequency of the measured signal and they are sensitive to mechanical stresses (cf. in particular document (3), p.43).

All these parameters, which are linked with a temperature sensitivity of approximately 100 ppm/° C. have the effect of limiting the current resolution of the sensors using the Hall effect to a value of at the best 1 mA.

Other current sensors known from documents (6) U.S. Pat. No. 4,616,174 (Jorgensen) and (7) "A new current sensor based on the measurement of the apparent coercive field strength", Derac Son and Johannes D. Sievert, IEEE transactions on instrumentation and measurement, Vol. 38, No. 6, Dec. 1989, pp. 1080 to 1082 make use of the non-linearities of the magnetic material constituting the aforementioned magnetic circuit. In the devices described in (6) and (7), the magnetic circuit is exposed to a pulsed magnetic field, whose mean value is zero.

The existence of a current to be measured has the effect of bringing about the appearance of paired components for the magnetic flux present in the magnetic circuit. It is therefore possible to gain approximately one order of magnitude for the current resolution compared with Hall effect sensors, but this involves a certain complication of the electronic circuits used.

In this connection reference can also be made to document (8) Documentation of Danfysik Jyllinge-Danmark on the NTRASTAB 860R (registered trademark) current transducer.

SUMMARY OF THE INVENTION

The present invention solves the problem of obtaining a current sensor comprising a magnetic circuit and a measuring device, as indicated hereinbefore, and whose current resolution is much better than that of the aforementioned sensors and can reach $10^{-2}$mA, which leads to a gain of two orders of magnitude for the current resolution compared with magnetic sensors using the Hall effect.

To solve this problem, the current sensor according to the invention is characterized in that its measuring device is a resonance directional magnetometer having a sample placed in the gap of the magnetic circuit, which is formed from a material having resonant spins and which is exposed to a magnetic field having a polarization parallel to the magnetic field produced in the gap or coinciding with the field produced in the gap and measuring means for exciting the resonance and detecting the excited resonance, by means of first magnetic means placed in the vicinity of the sample and for supplying the representative voltage.

It should be noted that the measurement of currents is a field very remote from resonance magnetometry, which essentially relates to the measurement of abnormalities of the terrestrial magnetic field.

It has been seen that the polarization magnetic field could be made to coincide with the magnetic field produced in the gap by a current passing through the magnetic circuit. In this case, it is the current which produces the polarization field.

According to a special embodiment of the sensor according to the invention, the measuring means comprise polarization means for producing the polarization magnetic field Hb, which is close to Ho, in which Ho is the value of the magnetic field applied to the sample at resonance, Ho being defined by the Larmor relation given hereinafter.

In this case, the polarization means can comprise a direct current source and a magnetic coil supplied by said d.c. source and which produces the polarization magnetic field Hb. This gives a sensor according to the invention in which the polarization magnetic field is approximately constant in time.

The measuring means can also comprise feedback or negative feedback means for producing in the sample, via second magnetic means, a compensation magnetic field which compensates the magnetic field Hlex produced in the gap and for supplying the representative voltage. The use of these feedback means leads to an improvement in the measurement dynamics and the linearity of the sensor according to the invention, as well as to an independence of the measurements with respect to the geometrical characteristics of the magnetic circuit gap.

However, it is also possible to produce sensors according to the invention, but which do not have the feedback or negative feedback means, i.e. sensors in which there is no compensation of the magnetic field created by the current to be measured.

In the case of a polarization field produced by a direct current, there is a problem associated with the stability of the polarization field Hb and which directly influences the measurement of the current flowing through the magnetic circuit. According to a preferred embodiment of the sensor according to the invention for solving this problem use is made of a square-wave pulsed polarization field, which leads to a better resolution.

More specifically, according to this preferred embodiment, the measuring means also have processing means for producing a square-wave current and creating in the gap a magnetic field pulsed between two values $$Ho - Hb + Hlex \text{ and } Hb - Ho + Hlex$$

in which Ho is the value of the magnetic field applied to the sample at resonance and Hb the polarization magnetic field, which is close to Ho, and the second magnetic means receives said pulsed squarewave current.

The feedback means can comprise an integrator, which is controlled by the processing means, and a voltage-current converter, whose input is connected to the integrator output and whose output supplies the second magnetic means.

According to a first embodiment, the processing means comprise:

electronic means for supplying the first magnetic means by a current at the Larmor frequency corresponding to Ho and for supplying at the output a voltage signal, whose variations as a function of the magnetic field applied to the sample correspond to the dispersion curve of said sample, a first electronic device connected to the output of the electronic means and permitting a voltage gain of alternately $+1$ and $-1$, a sample and hold circuit, whose input is connected to the output of the first electronic device and whose output controls the feedback means, a voltage source, a second electronic device supplied by said source and permitting a voltage gain of alternately $+1$ and $-1$ and another voltage-current converter, whose input is connected to the output of the second electronic device and which supplies the second magnetic means.

According to a second embodiment which, unlike the first, uses a synchronous detection, the processing means comprise:

electronic means for supplying the first magnetic means by a current at the Larmor frequency corresponding to Ho and for supplying at the output, as a result of a synchronous detection controlled by a voltage signal at an audio frequency, a voltage signal whose variations as a function of the magnetic field applied to the sample correspond to the derivative of the absorption curve of said sample, a first electronic device connected to the output of the electronic means and allowing a voltage gain of alternately $+1$ and $-1$, a sample and hold circuit, whose input is connected to the output of the first electronic device and whose output controls the feedback means, a voltage source, a second electronic device supplied by said source and allowing a voltage gain of alternately $+1$ and $-1$ and another voltage-current converter, whose input is connected to the output of the second electronic device and which supplies the second magnetic means.

According to a third embodiment, which also uses a synchronous detection, the processing means comprise:

electronic means for supplying the first magnetic means by a current at the Larmor frequency corresponding to Ho and for supplying at the output, as a result of a synchronous detection controlled by a voltage signal at an audio frequency, a voltage signal, whose variations as a function of the magnetic field applied to the sample correspond to the derivative of the absorption curve of said sample, a sample and hold circuit, whose input is connected to the output of the electronic means and whose output controls the feedback means, a voltage source, a summation means for supplying at the output a voltage signal equal to the sum of said voltage and a signal obtained from the synchronous detection at audio frequency, an electronic device connected to the output of the summating means and allowing a voltage gain of alternately $+1$ and $-1$ and another voltage-current converter, whose input is connected to the output of the electronic device and which supplies the second magnetic means.

In an advantageous embodiment of the sensor according to the invention corresponding to the case where the polarization is pulsed, said sensor also comprises means able to maintain respectively equal to Ho and $-Ho$ the maximum and minimum values of the polarization field.

The second magnetic means can also comprise at least one magnetic coil, which is wound around the magnetic circuit.

In a variant, said magnetic coil is placed in the gap and wound around the sample and the axis of said coil is parallel to the field Hlex.

Preferably, the measuring means incorporate a resonant circuit, which incorporates the first magnetic means and which is tuned to the resonant frequency fo, as well as means able to maintain the resonant circuit tuned to the frequency fo.

The sensor according to the invention can also comprise, around the first magnetic means and the sample, a means providing protection against the terrestrial magnetic field.

Finally, the sensor according to the invention can also comprise, around the first magnetic means and the sample, a means for providing protection against radio frequency electromagnetic fields.

BRIEF DESCRIPTION OF THE DRAWINGS

The invention is described in greater detail hereinafter relative to non-limitative embodiments and the attached drawings, wherein show:

FIG. 5 a diagrammatic view of another magnetometer usable in the invention.

FIG. 6 a curve which is the derivative of the curve of FIG. 4 and obtainable with the magnetometer of FIG. 5.

DETAILED DESCRIPTION OF THE PREFERRED EMBODIMENTS

Figure 1:
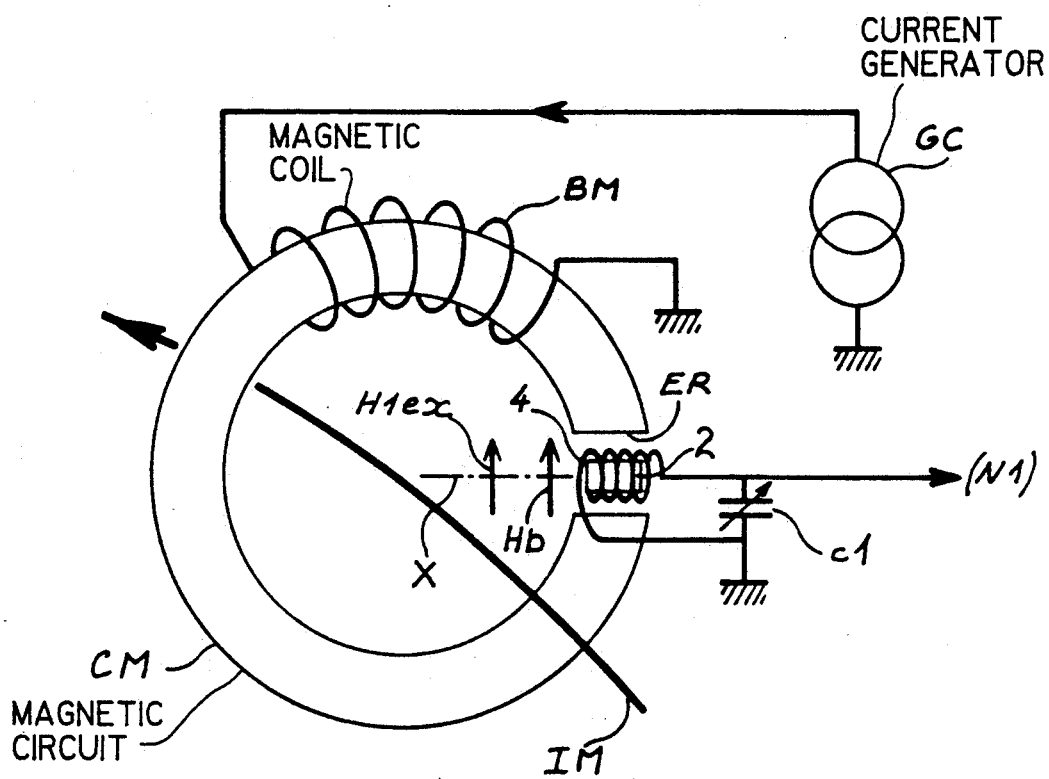
FIG. 1 diagrammatically a magnetic circuit usable in the present invention.

FIG. 1 diagrammatically shows a magnetic circuit CM usable in a sensor according to the invention. This magnetic circuit CM is made from a high permeability magnetic material, e.g. a ferromagnetic material and is e.g. shaped like a torus. The magnetic circuit CM can have a gap ER and surrounds a current to be measured IM.

This leads to a magnetic field Hlex in the gap ER and the value of this field is given by the formula Hlex = Nt.Iex/ep in which Nt represents the number of turns made by the current through the magnetic circuit and which is equal to 1 in FIG. 1, Iex represents the intensity of the current IM, ep represents the gap thickness or length and ER, in metres, typically has a value of a few millimetres.

Figure 2:
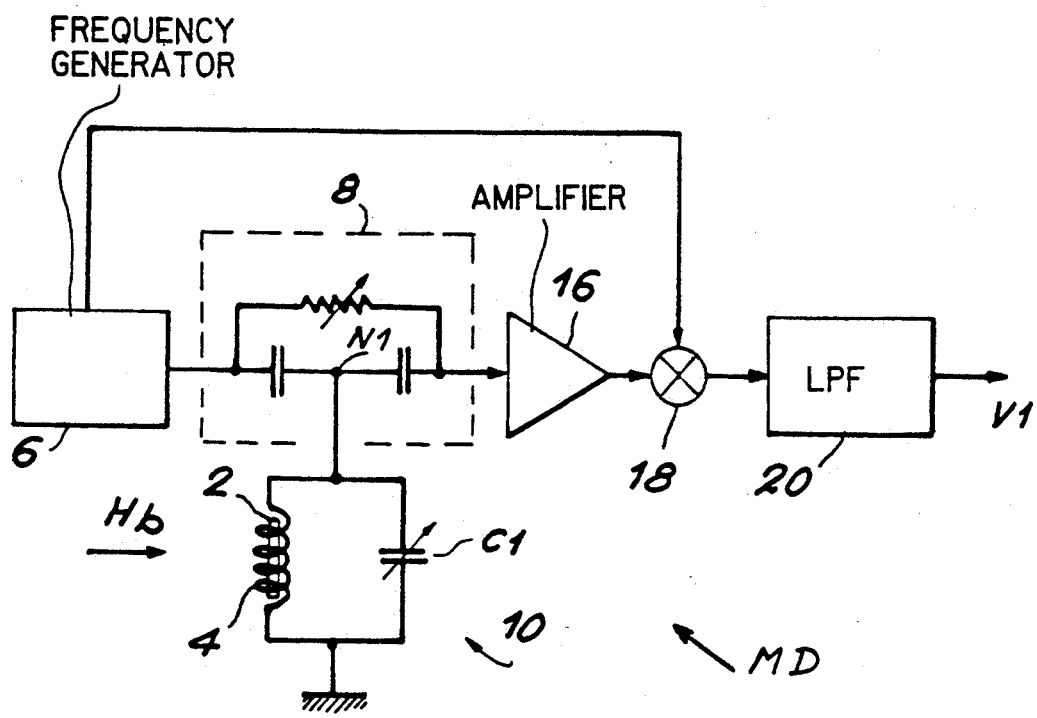
FIG. 2 a diagrammatic view of a magnetometer usable in the present invention.

FIG. 2 diagrammatically shows a measuring device which, with the magnetic circuit shown in FIG. 1, forms a current sensor according to the invention. The measuring device of FIG. 2 is a resonance directional magnetometer MD comprising a sample 2 formed from a material having resonant electronic spins, as well as an exciting and receiving coil 4 surrounding the sample 2.

The sample 2 with its coil 4 is placed in the gap ER (FIG. 1), so that the axis X of the coil 4 is perpendicular to the magnetic field Hlex in said gap ER. The sample 2 is exposed to said field Hlex resulting from the current IM, as well as to a polarization magnetic field Hb parallel to Hlex.

This polarization magnetic field Hb is created by a magnetic coil BM (FIG. 1), which is wound on the magnetic circuit and supplied by a constant current generator GC. The field Hb is equal to the number of turns of the coil BM multiplied by the intensity of the current from the generator GC and divided by the gap thickness.

In the case where the electronic spins resonate, the frequency fo of the resonance of these electronic spins is given by the Larmor relation: fo=g.Mo.Ho/(2pi), in which pi is the number equal to 3.14, g is the gyromagnetic ratio of the electron (g/2pi=28 GHz/T), Ho represents the magnetic field applied to the spins at resonance (expressed in A/m) and Mo=4.pi.$10^{-7}$ H/m. For information and in non-limitative manner, fo is equal to 40 MHz and Hb to 1.4 mT.

As can be seen in FIG. 2, a high frequency generator 6, regulated to fo, excites the resonance by means of a measuring bridge 8 and the coil 4 forming part of a resonant circuit 10, the latter being tuned to the frequency fo and having, besides the coil 4, a variable capacitor cl fitted between the terminals of the coil 4.

FIG. 2 shows a point Nl corresponding to a terminal common to the coil 4 and to the capacitor cl and opposite to the other common terminal, which is grounded or earthed.

The function of the measuring bridge 8 is to decouple the reception from the excitation.

The magnetometer of FIG. 2 also comprises a low-noise amplifier 16, a balanced mixer 18 and a low-pass filter 20.

It is pointed out that the measuring bridge 8 can be eliminated if a receiving coil is provided, which is both perpendicular to the direction of the polarization field in the gap and to the axis of the coil 4, which is then emitting and connected to the generator 6, the resonant circuit 10 being in this case solely connected to the amplifier 16 (so-called Bloch configuration).

The high frequency signal available at the output of the measuring bridge 8 is amplified by the amplifier 16 and fed to the input of the balanced mixer 18, whose reference signal is synchronous with the high frequency excitation.

More specifically, said reference signal is a signal having the same frequency as that of the exciting signal fed by the generator 6 to the measuring bridge 8, but whose amplitude and phase can be made different from those of the last signal. The output of the mixer 18 is filtered by the low-pass filter 20 to eliminate residues, as well as harmonics of the high frequency.

Figure 3:
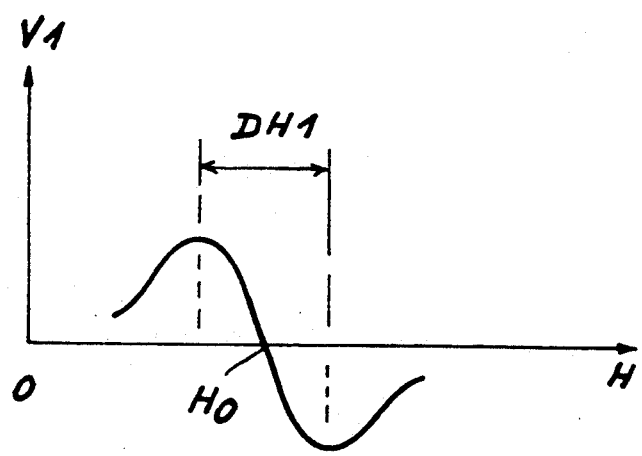
FIG. 3 a dispersion curve obtainable with the magnetometer of FIG. 2.

By fitting at the output of the low-pass filter 20 a not shown, appropriate observation device, it is possible to obtain with appropriate phases for the exciting signal and the reference signal, the curve of FIG. 3 representing variations of the output voltage of the filter 20 as a function of the magnetic field H applied to the sample in the gap ER and which is the sum of the polarization field Hb and the field produced by the current to be measured IM, resonance taking place when H is equal to Ho.

The curve of FIG. 3, which is called the "dispersion curve" is consequently usable for the determination of the magnetic field Hlex and therefore the intensity Iex of the current to be measured IM.

Figure 4:
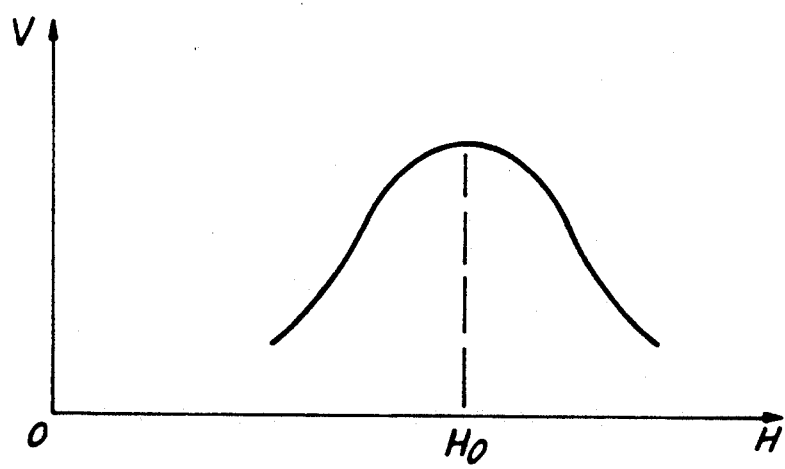
FIG. 4 the absorption curve of a resonant spin sample of the magnetometer of FIG. 2, the obtaining of the absorption curve or the dispersion curve simply taking place by a phase displacement of 90° of the detection reference 18.

By appropriately choosing the respective phases of the exciting signal and the reference signal, it is possible to obtain at the output of the filter 20, a voltage which is then designated V and whose variations as a function of the magnetic field H are shown in FIG. 4, the corresponding curve being called the "absorption curve".

With regards to the magnetometer shown in FIG. 2, reference can be made to (9) French patent application 8809830 of 20.7.1988 and EP-A-359598 by D. Duret and M. Beranger.

It is also possible to use another resonance directional magnetometer MD diagrammatically shown in FIG. 5 combined with the magnetic circuit CM of FIG. 1 for measuring the current Im.

The curve which can be obtained with the magnetometer shown in FIG. 5 and which can therefore be used in the present invention is the derivative of the absorption curve.

The magnetometer of FIG. 5 uses the sample 2, the coil BM and the coil 4, the generator 6, the measuring bridge 8, the resonant circuit 10, the amplifier 16 and the balanced mixer 18 arranged in the manner described hereinbefore.

The magnetometer of FIG. 5 also comprises an oscillator 22, which produces a signal (dither current) having an audio frequency fm and a coil 24 receiving said signal and which creates in the sample 2 a magnetic field of frequency fm referred to as the dither field.

The coil 24 in the gap ER is wound around the sample 2 (which is not visible in FIG. 5 for reasons of clarity) and its axis is parallel to the field Hlex. As a variant, the coil 24 could be wound on the magnetic circuit CM.

In connection with the coil BM instead of being wound on the magnetic circuit CM, it could be placed in the gap ER and surround the sample 2, its axis being parallel to the field Hlex.

In the magnetometer of FIG. 5, the low-pass filter of FIG. 3 is replaced, at the output of the balanced mixer 18, by a band-pass filter 26 around the frequency fm.

A phase shifter 28 receives the high frequency signal from the generator 6 and supplies to the balanced mixer 18, a signal having an adequate phase to obtain, at the output of said mixer 18, the voltage V of the curve shown in FIG. 4.

A synchronous detection means 30 at the frequency fm, which is controlled by a reference signal from the oscillator 22, has its input connected to the output of the filter 26 and supplies at the output a voltage Vs. This reference signal has a frequency fmi but its amplitude and phase can be made different from those of the signal supplied by the oscillator 22 to the coil 24.

By fitting at the output of the synchronous detection means a not shown appropriate observation means, it is possible to observe a curve shown in FIG. 6 and without any offset voltage. This curve represents the variations of the voltage Vs as a function of the field H and constitutes the derivative of the curve of FIG. 4.

The parameters making it possible to optimize the resonant materials and respective amplitudes of the high frequency field and the dither field are obtained by a process described in document (9).

In this connection it is pointed out that the polarization field Hb must be close to Ho in the sensors according to the invention which have already been described and in general terms in all the embodiments of the present invention.

The expression "Hb close to Ho" means that the absolute value of the difference between Hb and Ho is less than half the line width DH1 relative to the curve of FIG. 3, when use is made of this curve for the realization of the invention, or to half the line width DH2 of FIG. 6 when the curve of FIG. 6 is used for realizing the invention.

The current sensors described with reference to FIGS. 2 and 5 correspond to feedback-free sensors. At the output they supply a voltage proportional to the intensity of the current to be measured, the measuring range is, however, relatively restricted. Such sensors are more particularly usable for a "zero" detection, i.e. to know whether the intensity of a current is equal to, greater than or less than the known intensity of a reference current.

For such an application, the coil BM and the generator GC are not necessary and can be eliminated. Then, the polarization magnetic field is produced by the actual current Im, which passes through the magnetic circuit Cm.

Figure 7:
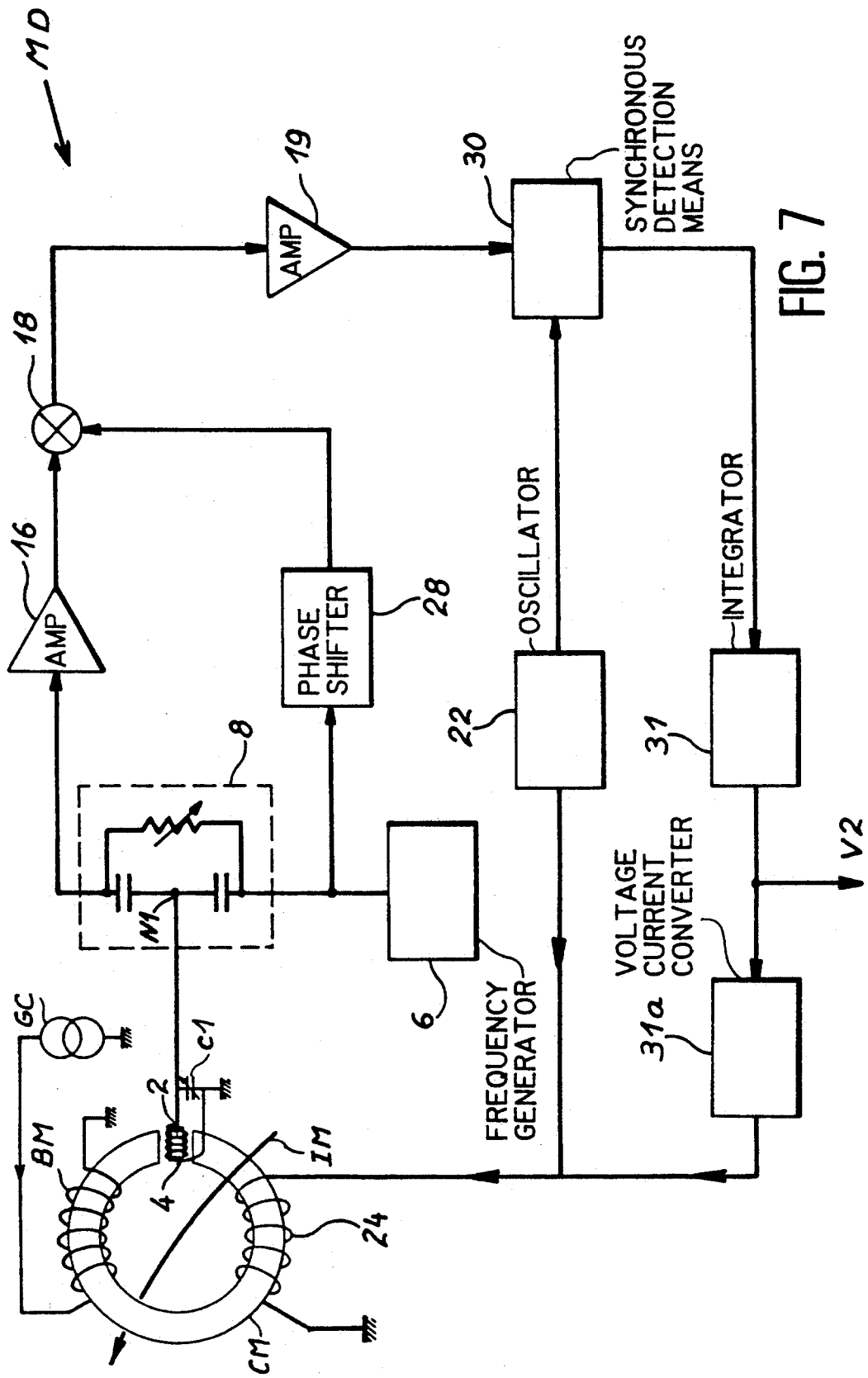
FIG. 7 a diagrammatic view of an embodiment of the sensor according to the invention.

The sensor according to the invention and shown diagrammatically in FIG. 7 makes use of a field feedback, which makes it possible to obtain a sensor having a linearity better than that of the sensors of FIGS. 2 and 5.

The inventive sensor shown in FIG. 7 is an improvement of the sensor described with reference to FIG. 5, in conjunction with FIG. 1.

Apart from the electronic circuit shown in FIG. 5, the sensor of FIG. 7 comprises an integrator 31, which integrates the voltage Vs supplied by the synchronous detection means 30 and a voltage-current converter 31a, which can be a resistor and which receives at the input the thus integrated voltage in order to supply at the output a current which also supplies the coil 24.

It can also be seen that the band-pass filter 26 of FIG. 5 has been replaced in the sensor of FIG. 7 by a low frequency amplifier 19, which amplifies the output voltage of the balanced mixer 18 and supplies said amplified voltage to the synchronous detection means 30.

In the sensor of FIG. 7, the supplementary field resulting from the current to be measured creates an error signal, which is superimposed on the resonance curve and used for cancelling out the magnetic field due to the current to be measured, as a result of the feedback loop comprising the integrator 31, the voltage-current converter 31a and the coil 24, which therefore has a supplementary function in the sensor of FIG. 7, namely producing the feedback field, which cancels out the field produced by the current to be measured.

The feedback current is an image of the current to be measured and the output voltage V2 of the integrator 31 is proportional to said current to be measured.

Thus, in place of a single coil 24, it would be possible to use two coils, one for producing the dither field and the other for producing the feedback field, said two coils being wound onto the magnetic circuit CM or placed in the gap around the sample 2 (the axes of said coils then being parallel to Hlex). It would even be possible to wind one of the two coils onto the magnetic circuit and place the other around the sample 2.

In a constructional variant corresponding to the case where the voltage-current converter 31a is a resistor, the output of the integrator 31 is directly connected to one terminal of the feedback coil (coil 24 in FIG. 7) and said resistor is fitted between the other terminal of the feedback coil and earth or ground, which makes it possible to recover the voltage V2 in said other terminal of the feedback coil.

Compared with the construction of FIG. 7, this not shown variant has the advantage that the corresponding sensor makes it possible to strictly measure the current IM, whereas in the case of FIG. 7 the measurement is disturbed by the appearance of a reactive term, due to the inductance of the feedback coil, in the proportionality factor linking the voltage V2 to the intensity of the feedback current.

The advantage of a sensor according to the invention using a feedback as compared with the sensors according to FIGS. 2 and 5 is that it makes it possible to measure a current of random intensity with high dynamics and a high accuracy.

The gain of this sensor is only dependent on the number of turns of the feedback coil and the gain of the voltage-current converter 31a.

For the use of a feedback or negative feedback in the field of magnetometry, reference can be made to (10) French patent application 8717566 of 16.12.1987, J. Crescini and D. Duret, cf. also U.S. Pat. No. 4,916,393.

The sensors according to the invention and described with reference to FIGS. 2,5 and 7 suffer from the disadvantage linked with the stability of the polarization field Hb, whereof all the variations are interpreted as a variation of the magnetic field produced by the current to be measured. This causes a problem during the measurement of a very low intensity current, which requires a very high stability polarization field Hb.

Figure 8:
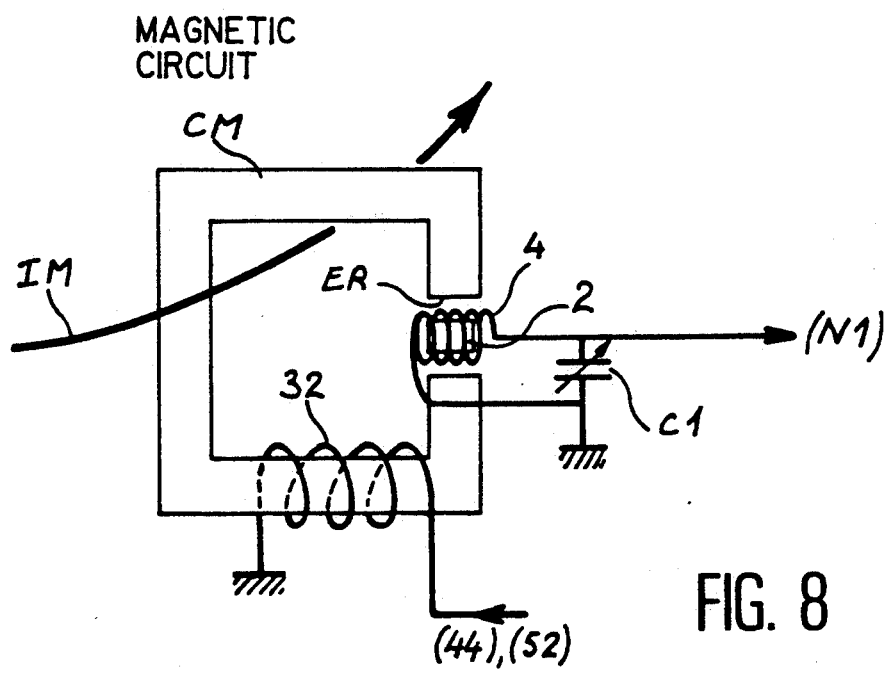
FIG. 8 diagrammatically another magnetic circuit usable in the present invention.

A description will now be given of a current sensor according to the invention having a magnetic circuit CH shown in FIG. 8, as well as a resonance directional magnetometer MD shown in FIG. 9 and which solves the aforementioned stability problem.

Figure 9:
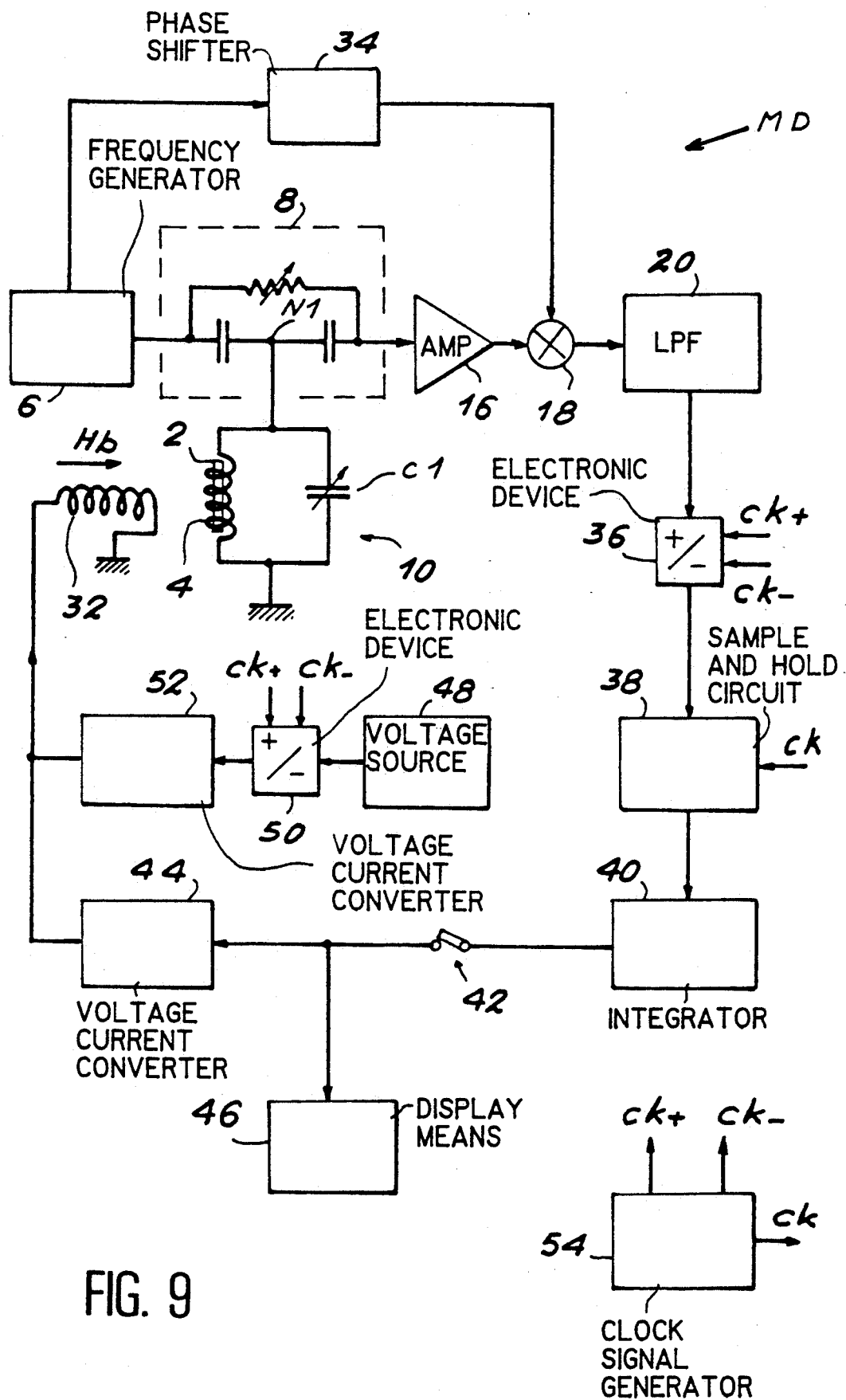
FIG. 9 a diagrammatic view of a magnetometer usable in the present invention, in which the magnetic polarization field is pulsed, the magnetic circuit not being shown.

The magnetometer of FIG. 9 has no time or temperature-based drifts and has a better resolution than the resonance directional magnetometers of FIGS. 2,5 and 7. For this purpose the magnetometer of FIG. 9 uses a square-wave pulsed polarization field Hb.

The resonance directional magnetometer MD diagrammatically shown in FIG. 9 comprises all the elements 2,4,6,8,10,16,18 and 20 in FIG. 2 arranged in the same way as the latter.

The sample usable in the present invention and in particular in the attached drawings is e.g. one of those described in pp. 3 and 4 of document (11), i.e. French patent application 8612278 of 1.9.1986, M. Dufour and C. Salvi. However, preference is given to the use of octasubstituted lithium phthalocyanines described in (12) French patent application 8809831 of 20.7.1988, cf. also U.S. Pat. No. 4,996,331.

This leads to a magnetometer and therefore a current sensor according to the invention having excellent performance characteristics.

It is also pointed out that the size of the magnetometer shown in FIG. 9 and those in the attached drawings can be reduced to a few millimetres by using microelectrics in their production.

In the case of FIG. 9, the polarization field is produced by a coil 32 and supplied in a manner defined hereinafter.

As can be seen in FIG. 9, said coil 32 is wound onto the magnetic circuit CM which, in the represented embodiment, is substantially square, apart from its gap. Thus, the coil 32 produces in the gap ER of the circuit CM a polarization field perpendicular to the axis of the coil 4 located in said gap ER.

In a not shown constructional variant, the coil 32 is placed in the gap ER around the sample 2 and its axis is parallel to the field Hlex.

The magnetometier of FIG. 9 also has a phase shifter 34 by means of which the high frequency signal fo of the generator 6 is supplied to the balanced mixer 18 and which is regulated in such a way as to phase shift said signal, so that the low-pass filter 20 supplies at the output the voltage V1, whose variations as a function of the field applied to the sample 2 are represented by the dispersion curve of FIG. 3.

The magnetometer of FIG. 9 also comprises an electronic device 36, a sample and hold circuit 38 and an integrator 40 fitted following the filter 20 and in the indicated order. The output of the integrator 40 is connected, across a switch 42 having two open-closed positions, to the input of a voltage-current converter 44, whose output supplies the coil 32.

At the output of the switch 42, which is closed during the operation of the magnetometer of FIG. 9 and therefore the corresponding current sensor, are fitted display means 46 making it possible to display the output voltage of the integrator 40.

The magnetometer of FIG. 9 also comprises a preferably stable and regulatable voltage source 48 making it possible, via a device 50 identical to the device 36, as well as a converter 52, to inject a stable current into the coil 32, so that the latter produces the field Hb approximately corresponding to the frequency fo.

Each of the converters 44 and 52 is e.g. an electrical resistor. Each of the devices 36 and 50 is an electronic device controlled by pulse-like clock signals ck+ and ck− and making it possible to achieve a voltage gain of +1 when the device receives a clock signal ck+ and −1 when it receives a clock signal ck−.

The sample and hold circuit 38 is e.g. of type AD585 of Analog Device. It is controlled by the pulse-type clock signal ck during which it "follows" the signal reaching its input and between which it stores the said signal. The clock signals ck,ck+ and ck− are defined by positive voltages.

Figure 12:
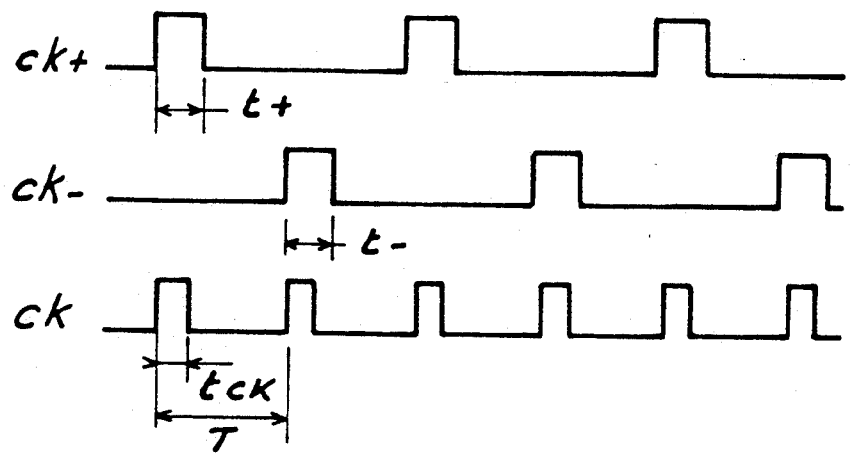
FIG. 12 a chronogram showing the clock signals used in the magnetometers shown in FIGS. 9 and 10.

A clock signal generator 54 makes it possible to appropriately control the devices 36 and 50 and the sample and hold circuit 38 by the signals ck, ck+ and ck−, whose chronogram is shown in FIG. 12. This generator 54 can be realized by means of a clock-controlled digital counter and state decoders making it possible to obtain the chronogram of FIG. 12.

Figure 10:
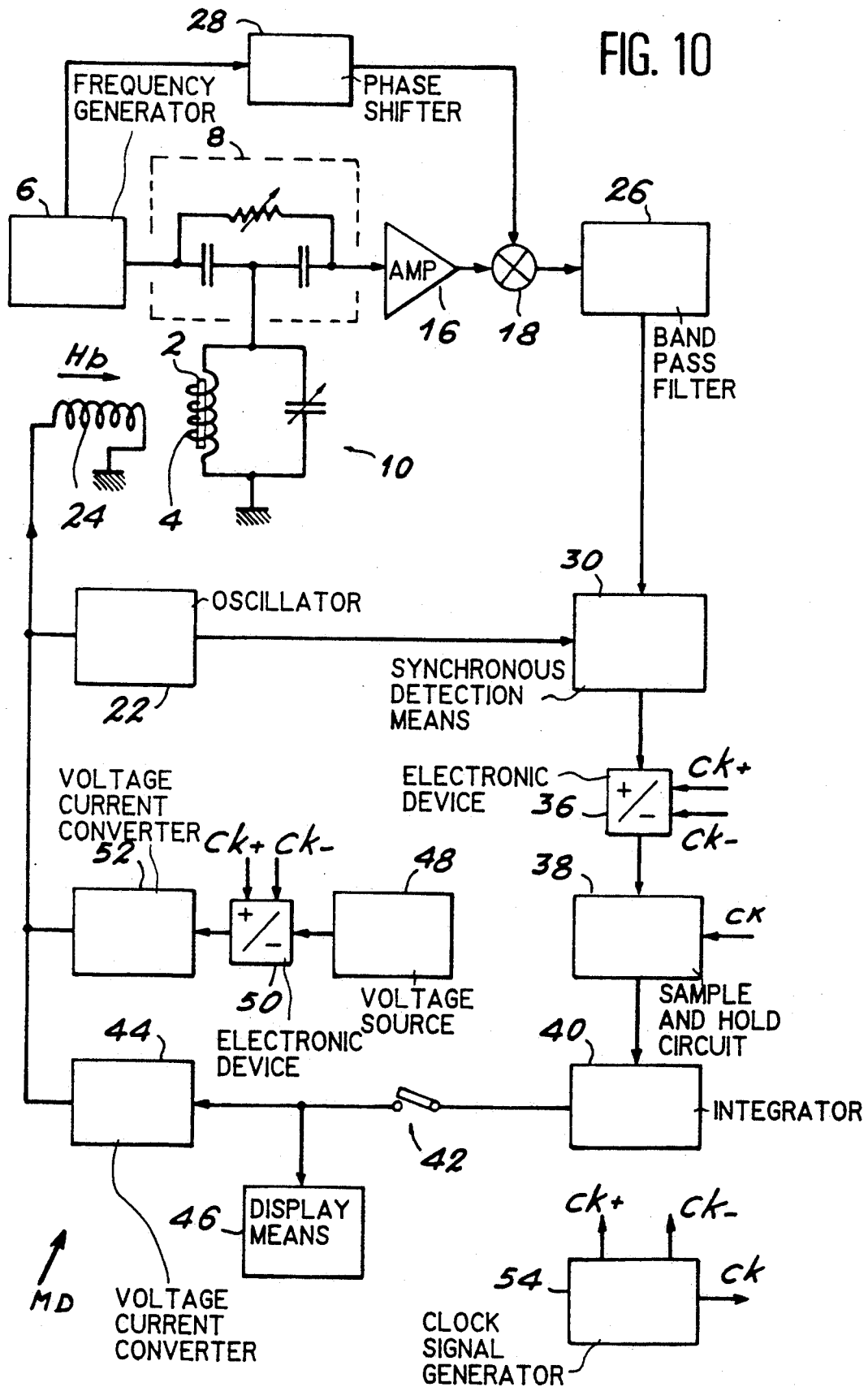
FIG. 10 a diagrammatic view of another magnetometer usable in the invention and provided with a synchronous detection.

Another magnetometer usable in the invention is diagrammatically shown in FIG. 10 and uses an audio frequency synchronous detection. The magnetometer MD of FIG. 10 comprises all the elements 2,4,6,8,10, 16,18,22,24,26,38 and 30 of FIG. 5 arranged in the same way as the latter.

The magnetometer of FIG. 10 also comprises the elements 36,38,40,42, 44,46,48,50,52 and 54 of FIG. 9 arranged as in the latter, except that in FIG. 10 the output of the synchronous detection means 30 is connected to the input of the device 36 and the converters 44 and 52 supply the coil 24 (the latter being wound onto the magnetic circuit CM or placed in the gap ER around the sample 2 and then having its axis parallel to the field Hlex).

In FIG. 10 the output of the synchronous detection means 30 supplies the voltage Vs, whose variations as a function of the field applied to the sample 2 are represented by the curve of FIG. 6.

Figure 11:
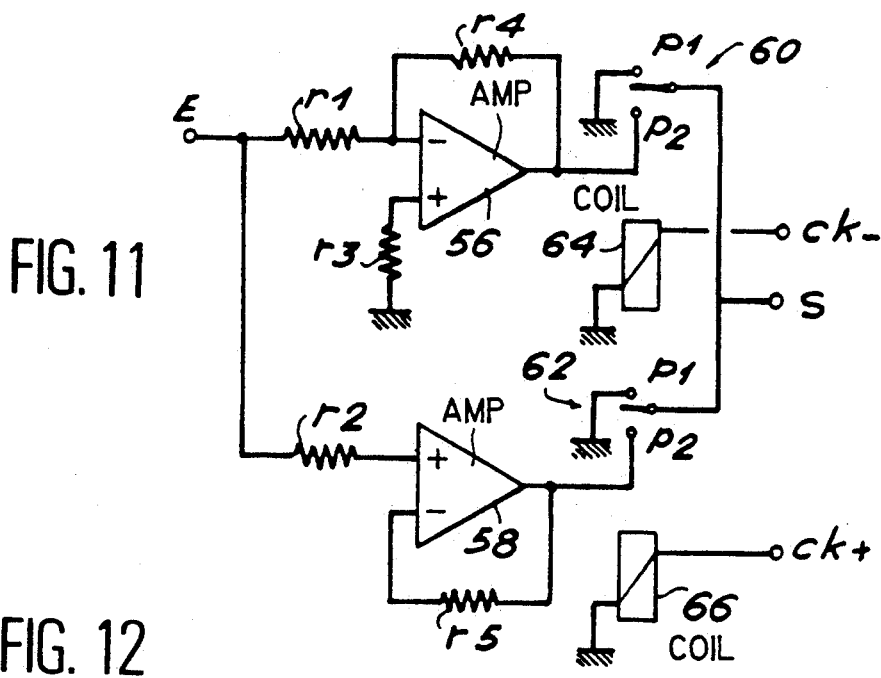
FIG. 11 diagrammatically an electronic device used in the magnetometers shown in FIGS. 9 and 10.

A known exemplified embodiment of the device 36 or 50 is diagrammatically shown in FIG. 11 and comprises two differential amplifiers 56 and 58 and two electromagnetic relays 60 and 62 having two positions p1 (inoperative) and p2 (operative), whose respective coils 64 and 66 are shown in FIG. 11.

The input E of the device of FIG. 11 is connected to the inverting input of the amplifier 56 across a resistor r1 and to the non-inverting input of the amplifier 58 across a resistor r2. The non-inverting input of the amplifier 56 is earthed or grounded by means of a resistor r3. The output of the amplifier 56 is connected to its inverting input by means of a resistor r4. The output of the amplifier 58 is connected to its inverting input by means of a resistor r5.

For example, the resistors r1,r2,r4 and r5 are 100 kiloohms, whilst the resistor r3 is 47 kiloohms.

Between two pulses ck−, the relay 60 is in position p1 and during each pulse ck− in position p2, in which the output S of the device of FIG. 11 is connected to the output of the amplifier 56. Between two pulses ck+ the relay 62 is in position p1 and during each pulse ck+ in position p2, in which the output S is connected to the output of the amplifier 58.

The chronogram of FIG. 12 will now be described. The signals ck are pulses of time width tck and period T. The signals ck+ are pulses of time width t+, exceeding tck, and period 2T. The signals ck are pulses of time width t−, exceeding tck, and period 2T. The pulses ck are alternately covered by pulses ck+ and pulses ck−.

The operation of the magnetometers of FIGS. 9 and 10 will now be described. Switch 42 is assumed to be open. The value of the intensity I of the current in the coil 24 or 32 is regulated in such a way that the corresponding field H (total field to which the sample is exposed) is approximately "in the centre" of the resonance (H differing only slightly from Ho).

Figure 13:
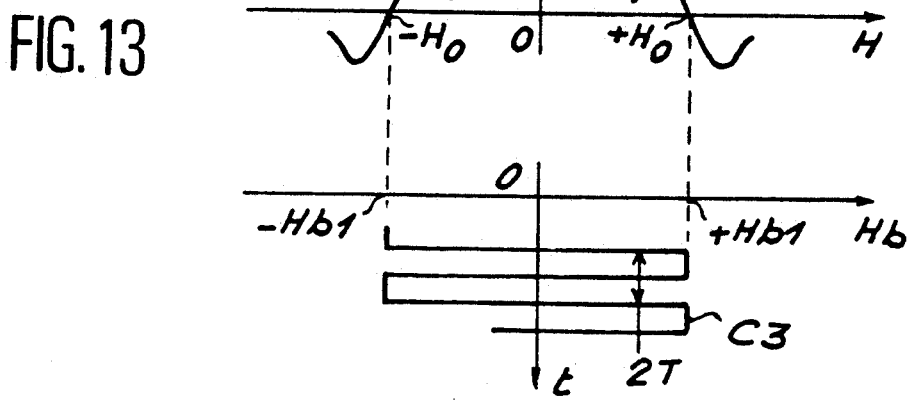
FIG. 13 magnetic field-voltage and time-magnetic field curves illustrating the operation of the magnetometers shown in FIGS. 9 and 10.

The variation of the voltage V1 or Vs at the output of the filter 20 (or synchronous detection means 30) for a positive or negative variation of H is given by the double curve C1-C2 in FIG. 13.

Hereinafter, to facilitate the description, the notation VS will represent both V1 and Vs. C1 is a curve as in FIG. 3 or FIG. 6 and C2 is symmetrical to C1 with respect to the coordinate axis VS.

During a pulse ck+ of the chronogram of FIG. 12, the voltage at the output of the filter 20 or synchronous detection means 30 is $$VS+ = -K \cdot (Hb - Ho + Hlex) + Voff$$

K being a positive proportionality constant corresponding to the approximately linear part of the curve of FIG. 13 and Voff an offset voltage, residual voltage taking account of defects of the electronic equipment.

The above expression of VS+ applies if Hlex is sufficiently small to remain in the linear part of the curve of FIG. 13.

During a pulse ck−, the voltage at the output of the filter 20 or synchronous detection means 30 is $$VS- = K \cdot (-(Hb-Ho) + Hlex) + Voff$$

because, during a pulse ck−, one is at the side of the negative values of H and the device 50 transforms the value Vo of the voltage supplied by the source 48 into the opposite value −Vo.

FIG. 13 shows that the polarization field Hb then varies during time in the form of square-wave pulses (curve C3), between two values Hbl and −Hbl, Hbl being proportional to Vo.

The peak value (Hbl) of said scan corresponds to the maximum of the slope of the curve of FIGS. 3 or 6 at resonance (H=Ho).

Magnetometer errors result from variations of the voltage Vo supplied by the source 48 and of Voff (representing drifts of the electronic equipment).

We will now show that the magnetometers of FIGS. 9 and 10 compensate these errors.

Figure 14:
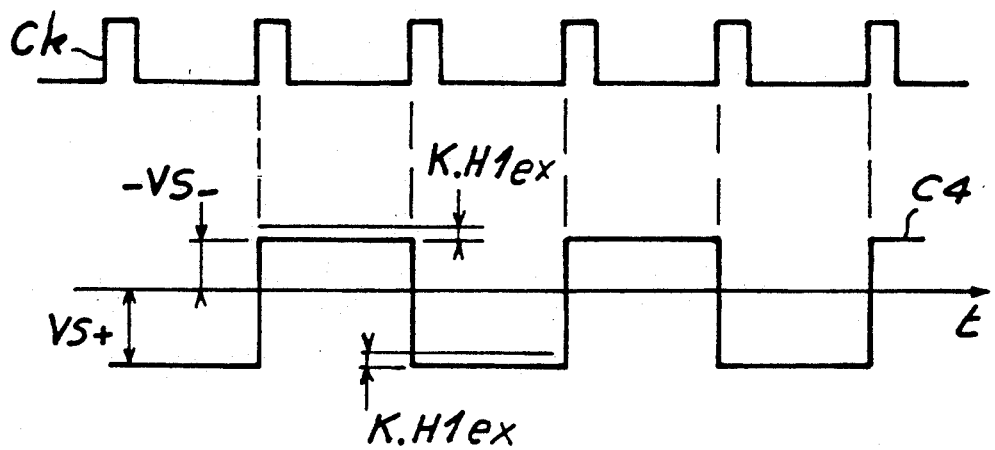
FIG. 14 another chronogram illustrating the operation of the magnetometers of FIGS. 9 and 10.

At the output of the device 36, the voltage VS is inverted during the pulse ck−. The sample and hold circuit 38 stores its input values during dead times and samples them during the pulses ck appearing "within" pulses ck+ and ck−, in accordance with the chronogram of FIG. 12. The signal present at the output of the sample and hold circuit 38 is represented by the curve C4 of FIG. 14.

It is a succession of values $$-K(Hb-Ho+Hlex)+Voff \text{ and}$$
$$-K(-(Hb-Ho)+Hlex)-Voff$$

i.e. VS+ and −VS−, whose mean value is $((VS+)+(-VS-))/2 = -K \cdot Hlex$.

If Hlex varies slowly (i.e. if the intensity of the current to be measured varies slowly), it is consequently possible to follow its variations by a low-pass filtering at the output of the sample and hold circuit 38. In this way, the slow drifts are eliminated.

Thus, it is a sampled system, whose sampling frequency fe is the inverse of the time T separating two pulses ck. In accordance with the theory of such systems, the maximum pass band of the input signal (Hlex) is equal to fe/2.

When the switch 42 is closed, the output signal of the sample and hold circuit 38 intervenes as an error signal in the feedback loop. Its mean value is maintained at zero by said loop and by means of the integrator 40 and the converter 44, a feedback current is produced in the coil 24 or 32 and opposes variations of Hlex.

In this case, provided that the system has been "attached" to the resonance, the "follow" can significantly exceed the linear part of the curve of FIG. 13, because one is still centered on the resonance.

The linearity is now only dependent on the transfer between the current and the field in the coil 24 or 32. At the output of the closed switch 42, a voltage signal is obtained constituting an image of the feedback field and which is proportional to Hlex.

The display means 46 make it possible to know Hlex and therefore the intensity of the current to be measured Im.

The switch 42 can be eliminated, the integrator 40 then being directly connected to the converter 44 and in this case the display means 46 are connected to the output of the integrator 40.

Figure 15:
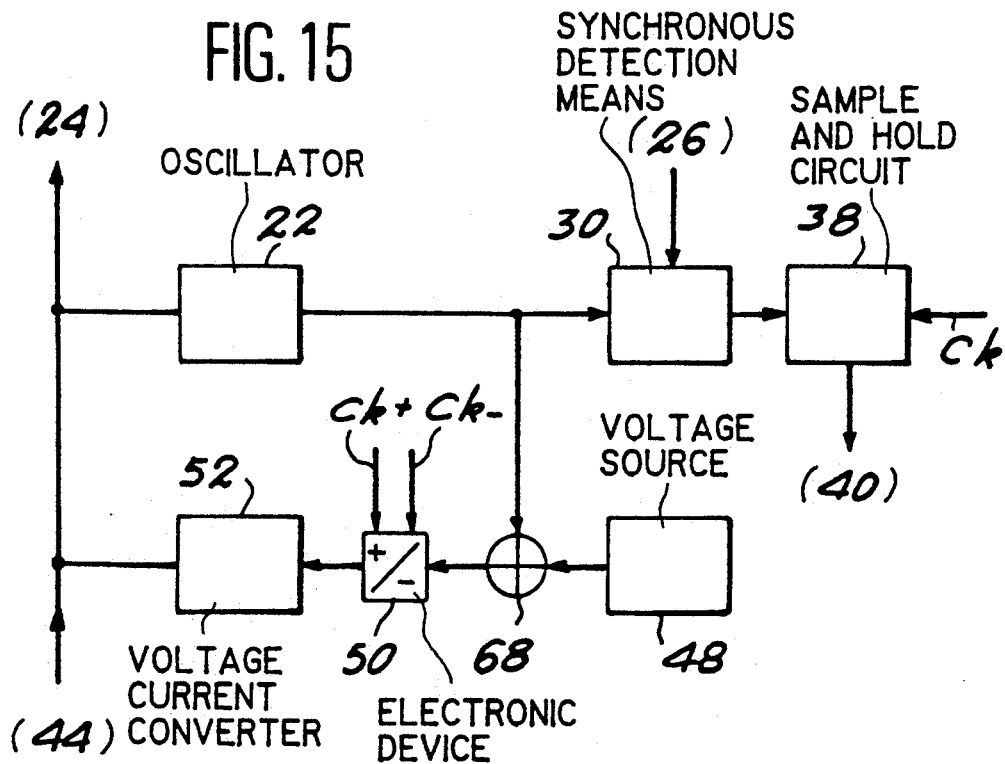
FIG. 15 diagrammatically and partly a variant of the magnetometer of FIG. 10.

A variant of the magnetometer of FIG. 10 is diagrammatically and partly shown in FIG. 15. In this variant use is once again made of a synchronous detection at the audio frequency fm, but the device 36 is eliminated. The sign reversal performed by said device is replaced by a 180° switching, at each pulse ck−, of the phase of the exciting signal of frequency fm.

As shown in FIG. 5, this is carried out by a summation means 68 fitted between the voltage source 48 and the device 50. This summation means 68 receives at the input the voltage Vo supplied by the source 48 and the frequency signal fm from the oscillator 22 and supplies to the device 50 the sum of the latter.

In the magnetometers of FIGS. 9 and 11, the use of a symmetrical clock signal generator 54, so that t+ and t− are equal to T, makes it possible to eliminate the sample and hold circuit 38, the output of the device 36 then being directly connected to the integrator 40.

It should be noted that the magnetometers of FIGS. 9,10 and 15 essentially differ from those of FIGS. 2,5 and 7 by the use of a squarewave pulsed polarization field Hb. The use of a pulsed field Hb makes it possible to eliminate the slow time and temperature drifts, particularly those of the polarization current I fed into the coil 24 or 32.

The use of a square-wave field of period 2T in the case of FIG. 12 makes it possible to work at the maximum slope location (by regulating Vo in FIGS. 9,10 and 15) of the dispersion curve or the derivative of the absorption curve and therefore improve the signal-to-noise ratio.

The sample and hold circuit makes it possible to avoid parasitic oscillations liable to occur during the supply of the coil 24 or 32 by a square-wave current.

The reduction of t+ and t− compared with T (FIG. 12) makes it possible to reduce the power dissipated in the coil 24 or 32 and therefore the magnetometer energy consumption.

The use of a square-wave field Hb associated with a sample and hold circuit also reduces the consumption of the magnetometer.

There is a further advantage of the magnetometers of FIGS. 9 and 10, namely the compensation of offset voltages and the drifts inherent in electronic equipment.

The sensor according to the invention is not limited to electronic paramagnetic resonance. It can use a nuclear magnetic resonance. The sample used in the invention can contain nuclear, e.g. proton spins in place of electronic spins.

In a constructional variant of the magnetometer shown in FIG. 9, the coil 32 is only connected to the converter 52 and makes it possible to produce the polarization field Hb.

Figure 16:
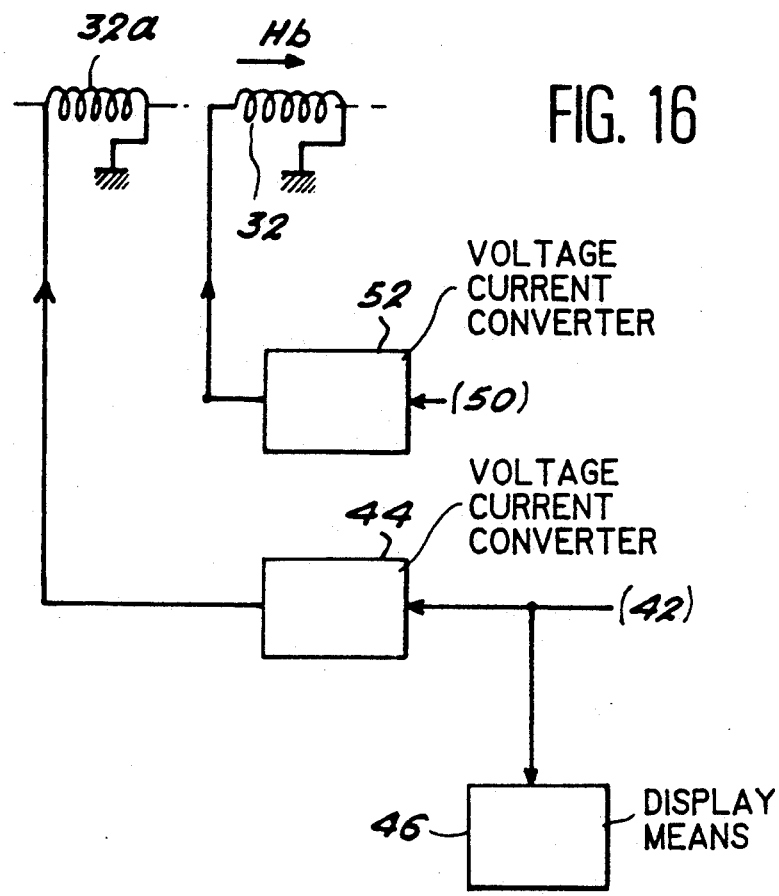

Another coil 32a (FIG. 16) is connected on the one hand to earth and on the other to the output of the converter 44 and said coil 32a compensates the field Hlex. The coils 32 and 32a can both be wound onto the magnetic circuit CM.

As a variant, they are placed in the gap ER and wound around the sample 2 having the same axis, which is parallel to the magnetic field produced in the gap ER by the current to be measured (the axis of the coil 4 being perpendicular to said field).

In another variant, one of the coils 32 and 32a is wound onto the magnetic circuit CM and the other coil is placed in the gap ER and wound around the sample and its axis is parallel to the magnetic field produced in the gap by the current to be measured.

Figure 17:
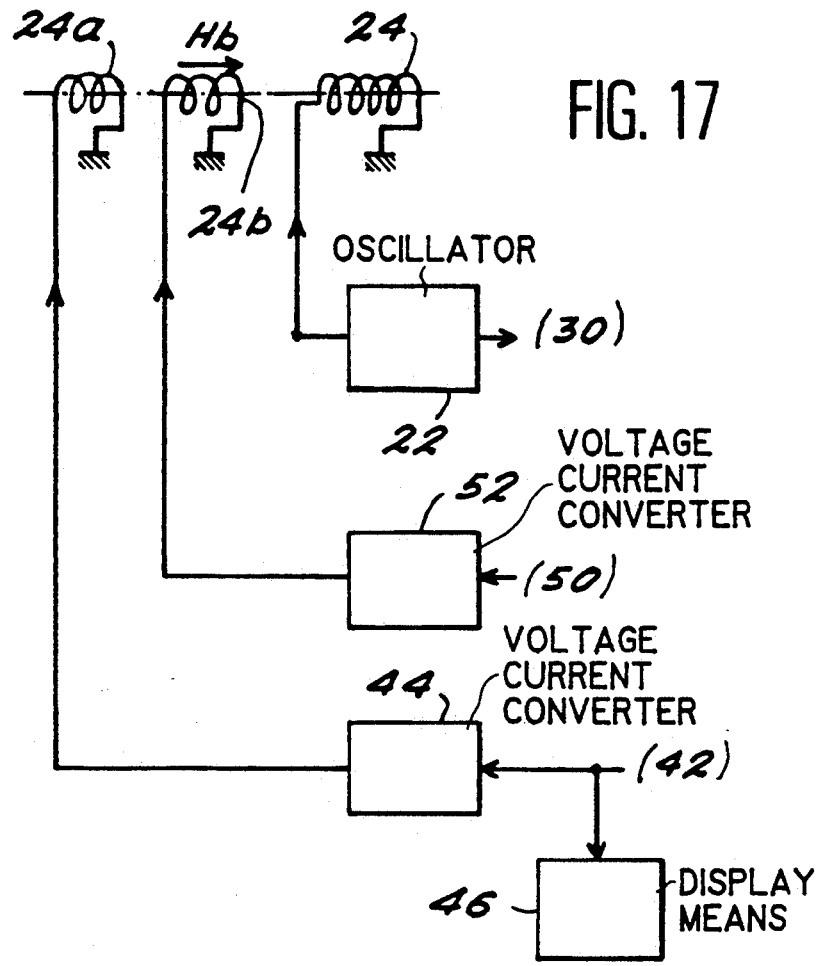
FIGS. 16 to 23 diagrammatically variants of the magnetometers of FIGS. 9 and 10.

In a constructional variant of the magnetometer of FIG. 10, the coil 24 is only connected to the oscillator 22 and makes it possible to create the audio frequency dither field. Another coil 24a (FIG. 17) is connected on the one hand to earth and on the other to the output of the converter 44 and said coil 24a compensates the field Hlex.

A supplementary coil 24b is connected on the one hand to earth and on the other to the output of the converter 52 and makes it possible to produce the polarization field Hb. The coils 24,24a,24b can all be wound onto the magnetic circuit CH.

As a variant, they are placed in the gap ER, wound around the sample 2 and have the same axis, which is parallel to the magnetic field produced in the gap ER by the current to be measured.

In other variants, one or two of these three coils is or are wound onto the magnetic circuit and the other or others is or are placed in the gap, wound around the sample and have the same axis, which is parallel to the field Hlex (respectively is placed in the gap, wound around the sample and has its axis parallel to the field Hlex).

In a not shown variant of the magnetometer of FIG. 10 use is made of two coils, one of them being connected to one of the three elements 22,44 and 52 with a view to fulfilling one of the three following functions, i.e. the creation of Hb, the creation of the dither field and the compensation of Hlex. The other of the two coils is connected to two other of the three elements for fulfilling two other functions, e.g. one of the two coils is connected to the oscillator 22 for producing the dither field and the other coil is connected to the converters 44 and 52 for creating the polarization field Hb and for compensating the field Hlex.

The resonant circuit 10 (cf. FIGS. 9 and 10), which is tuned to the frequency fo can become deregulated. To maintain said resonant circuit 10 tuned to the frequency fo, it is possible to modify the magnetometer of FIG. 9, as will be explained hereinafter relative to FIG. 18. To the resonant circuit 10 is added a capacitor c2, a variable capacitance diode D1, a bias resistor R1 and a capacitor c3. Moreover, to the magnetometer of FIG. 9 are added a sample and hold circuit 10a and an integrator 10b.

In a purely indicative and non-limitative manner, the diode D1 is of the type marketed by RTC under reference OF 643, the resistor R1 is 100 kiloohms and both the capacitors c2 and c3 have a capacitance of 10 nF.

The terminal B1 of the resonant circuit 10, which is common to the coil 4 and to the variable capacitor c1 and which is earthed or grounded, is connected to the anode of the diode D1. The cathode of the latter is connected to one terminal of the capacitor c2 (whose function is to avoid the short-circuiting of the diode D1 by the coil 4) and to one terminal of the resistor R1. The other terminal of the capacitor c2 is connected to the other terminal B2 of the variable capacitor c1.

The sample and hold circuit 10a is controlled by the pulse-like clock signals cb and its input is connected to the output of the balanced mixer 18, whilst its output is connected to the input of the integrator 10b. The output of the latter is connected to the other terminal of the resistor R1, as well as to one terminal of the capacitor c3, whose other terminal is earthed and whose function is to prevent leaks of high frequency signals to the integrator 10b, said signals coming from the generator 6. The signals cb used for controlling the sample and hold circuit 10a are defined by positive voltages. These signals cb, whose chronogram is shown in FIG. 19, are logic square-wave signals, whose non-zero pulses appear outside those of the signals ck+ and ck−.

Figure 19:
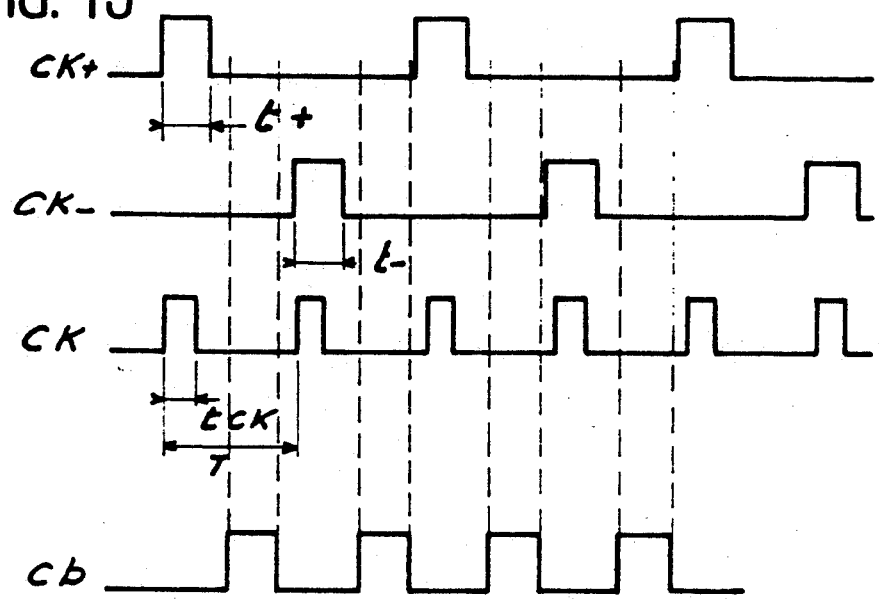

Like the latter, the signals cb are supplied by the generator 54, which is appropriately modified so as to obtain the chronogram of FIG. 19.

The magnetometer MD of FIG. 10 can be modified in the manner explained hereinafter with reference to FIG. 20 in order to maintain its resonant circuit 10 tuned to the frequency fo.

Figure 18:
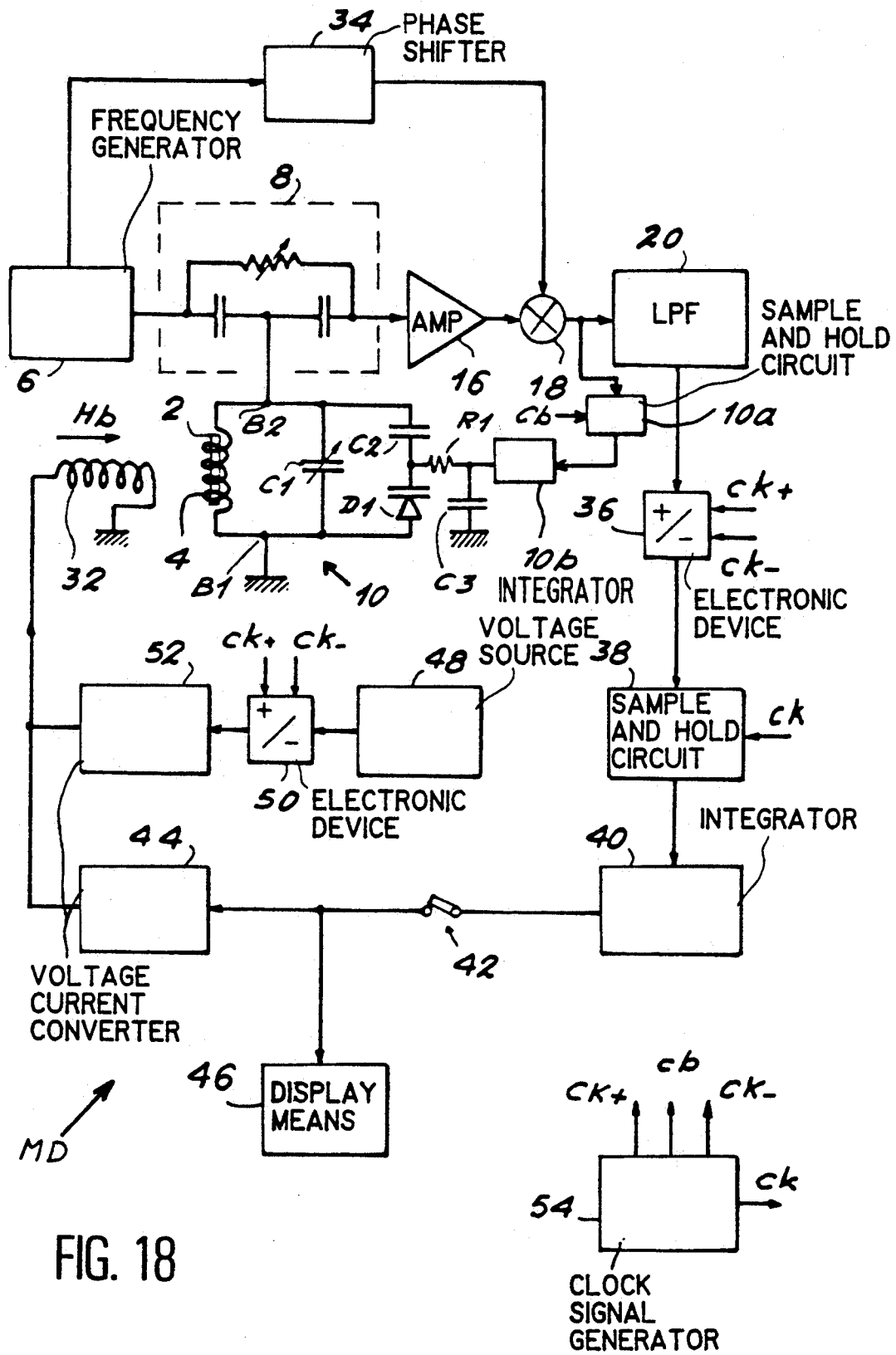
Figure 20:
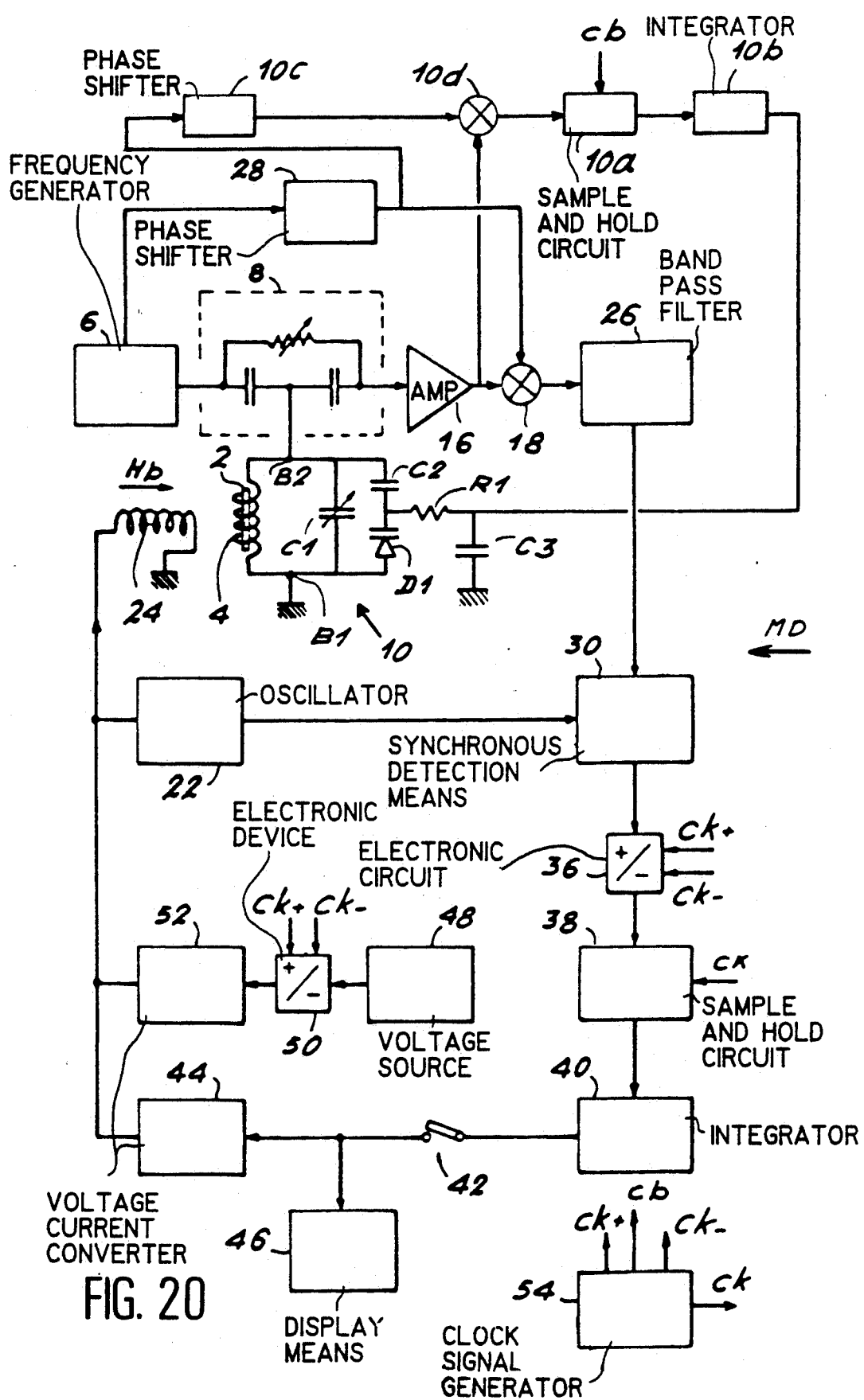

To the magnetometer of FIG. 10 are added the elements c2,c3,D1,R1,10a and 10b arranged in the same way as in FIG. 18, except that the input of the sample and hold circuit 10a is not, in the case of FIG. 20, connected to the output of the mixer 18. To obtain the magnetometer of FIG. 20, to the magnetometer of FIG. 10 is also added a phase shifter 10c and another balanced mixer 10d (of the same type as mixer 18). The phaser shifter 10c receives the high frequency signal from the phase shifter 28 and supplies the mixer 10d with a reference signal phase shifted by $+90°$ or $-90°$ compared with the reference signal of the mixer 18, the sign of said phase shift being chosen in such a way that the feedback of the tuning of the resonant circuit is stable. The output signal of the amplifier 16 is also fed to the input of the mixer 10d, whose output is connected to the input of the sample and hold circuit 10a.

Figure 21:
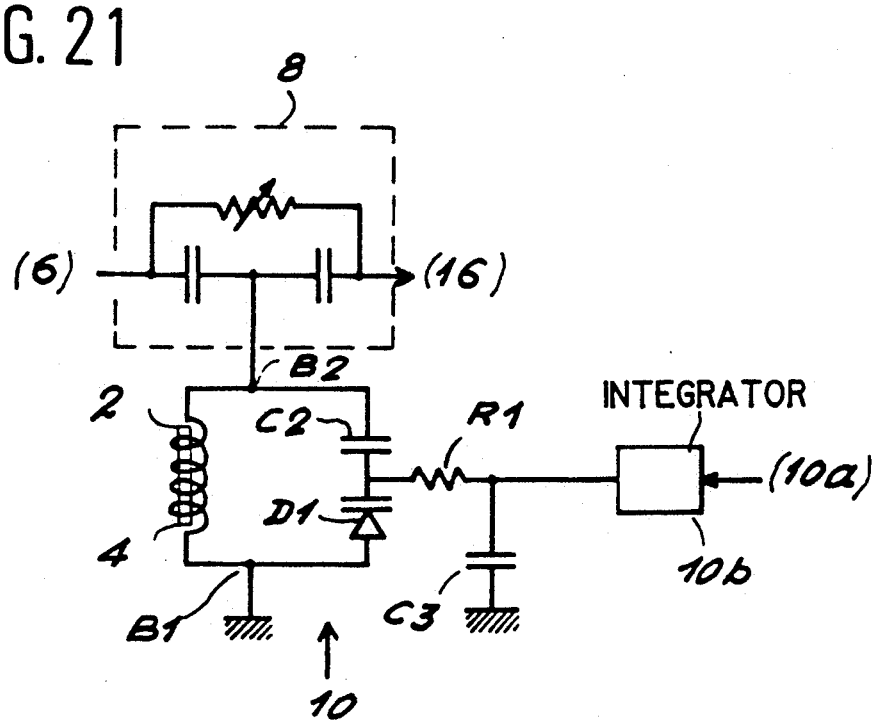

In a constructional variant, the variable capacitor cl of FIGS. 18 and 20 is eliminated in the manner shown in FIG. 21. The assembly D1-C2 is then fitted between the terminals B1 and B2.

The magnetometers MD of FIGS. 9,10,18 and 20 can advantageously be provided with means making it possible to automatically maintain the polarization of the sample 2 at a value Hbl equal to Ho (or more precisely maintain respectively equal to Ho and $-$Ho the maximum values Hbl and minimum values $-$Hbl of Hb in an automatic manner), by making the voltage source 48 dependent on an error signal Veps obtained by performing the operation:

$$Veps = (VS+) + (VS-) = -2K.(Hb-Ho) + 2Voff.$$

If it is possible to ensure that Voff is small or more precisely negligible compared with K.(Hb$-$Ho), which is possible by using limited @5 drift electronic circuits, the term Veps makes it possible to bring about dependence of the voltage Vo, so that Hbl is strictly equal to Ho. Without this, a slight variation of Hbl around Ho reduces no drift of the magnetometers, but leads to a deterioration of the signal-to-noise ratio on passing outside the maximum slope zone of the curve of FIG. 3 or that of FIG. 6 (see also document (9)).

Moreover, the regulation of the source 48 to the value Vo can be difficult if there is a fine resonance line, i.e. if DH1 and DH2 are small compared with Ho.

Figure 22:
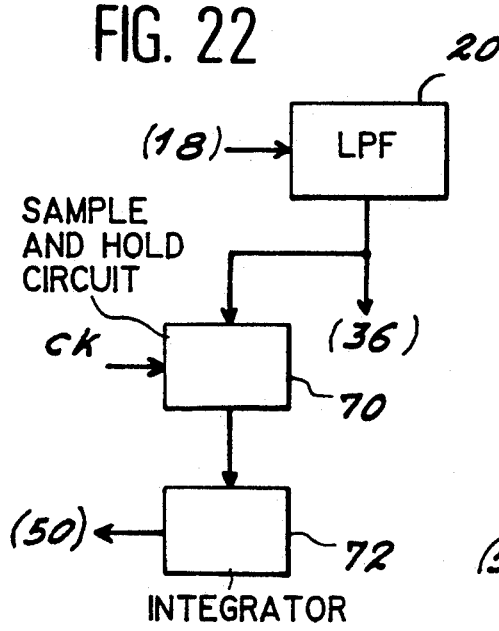
Figure 23:
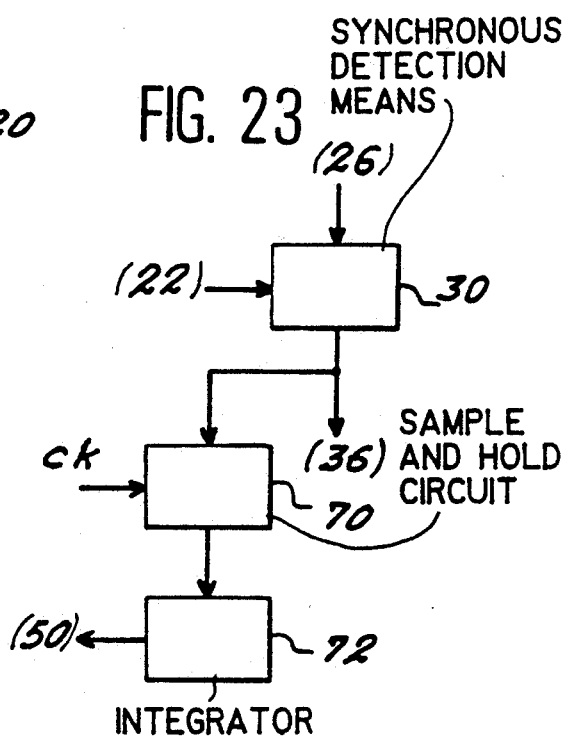

Therefore the automatic maintenance of the polarization of the sample at value Ho is advantageous in that it makes it possible to operate the magnetometers with an optimum signal-to-noise ratio and obviates the regulation of the voltage source 48. This automatic maintenance is obtained (cf. FIGS. 22 and 23) by replacing the source 48 by the association of a sample and hold circuit 70 identical to 38 and an integrator 72 identical to 40.

More specifically, for a magnetometer like that of FIG. 9, the output signal of the filter 20 (FIG. 22) is supplied not only to the device 36, but also to the input of the sample and hold circuit 70, which is controlled by the signals ck and whose output is connected to the input of the integrator 72. The output of the latter is connected to the input of the device 50.

For a magnetometer like that of FIG. 10, it is the output signal of the synchronous detection means 30 (FIG. 23), which is supplied not only to the device 36, but also to the input of the sample and hold circuit 70. The latter is connected to the integrator 72, which is itself connected to the device 50, as hcfts been shown hereinbefore relative to FIG. 22.

At the output of the integrator 72, there is consequently a voltage Vo proportional to Ho (value of the magnetic field linked with the resonant frequency fo of the spins by the Larmor relation).

In the already described sensors according to the invention, the coil 4 (radio frequency coil) forms an antenna, which is liable to detect unwanted signals or run-out. To obviate this disadvantage, to a sensor according to the invention is added a radio or high frequency shield impermeable to radio or high frequency fields, whose frequencies are close to the resonant frequency fo of the sensor and which is permeable to the magnetic field produced by the current to be measured, to the polarization magnetic field when the latter is produced by a coil formed on the magnetic circuit (e.g. FIG. 1) and in general terms to low and possibly zero frequency magnetic fields, which are liable to be produced by one or more coils formed on said magnetic circuit.

Figure 24:
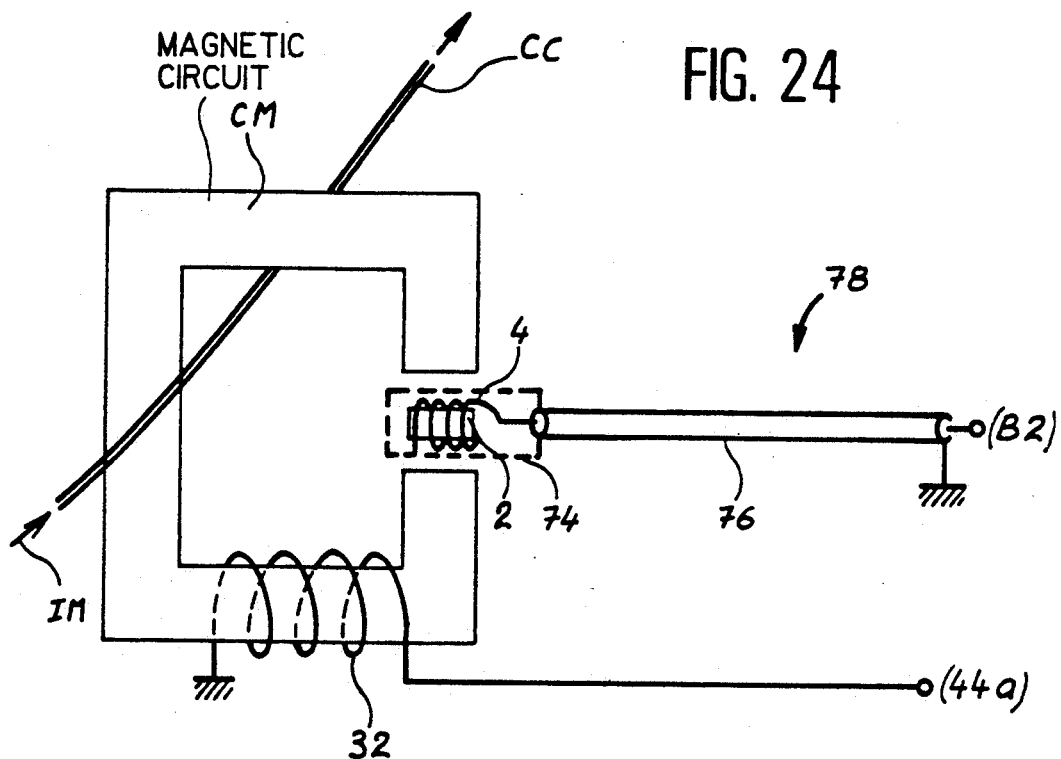
FIG. 24 diagrammatically the possibility of using a high frequency shield for the resonant spin sample.

This is illustrated by FIG. 24, where the coil 32 is used for producing the square-wave pulsed polarization field and the feedback field, is formed on the magnetic circuit CM through which flows the current to be measured IM and which is e.g. transported by means of an electric conductor CC passing through the magnetic circuit CM.

In FIG. 24 it can be seen that the high frequency shield is constituted by an e.g. copper envelope 74 located in the gap of the magnetic circuit CM and containing the sample 2 and the coil 4.

One terminal of the coil 4 is electrically connected to the inner wall of the envelope 74, which is electrically connected to the braiding 76 of a coaxial cable 78, said braiding being earthed. The other terminal of the coil 4 is electrically connected to one end of the core of said coaxial cable 78, whose other end is the point B2 shown in FIG. 18.

Figure 25:
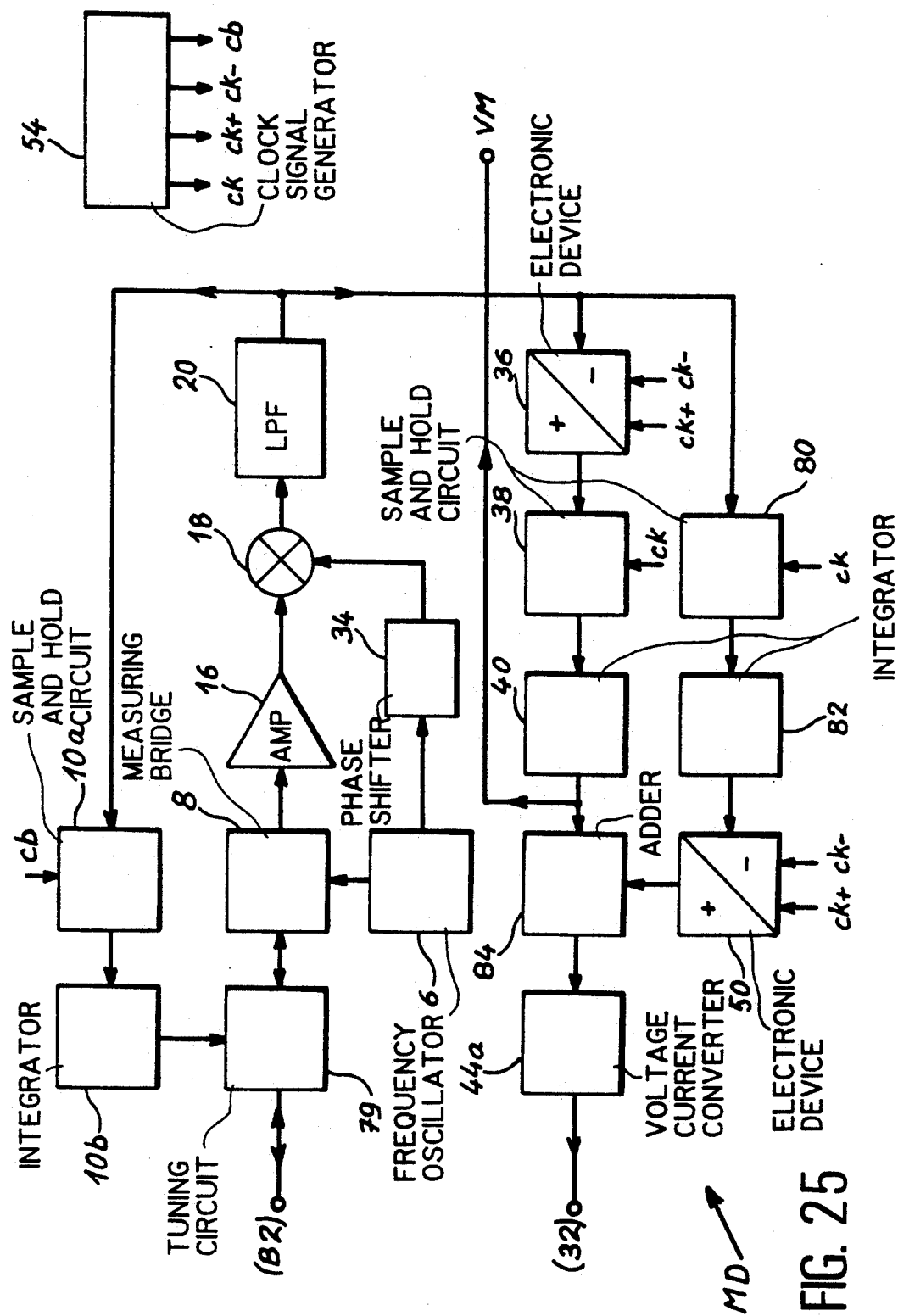
FIG. 25 diagrammatically and partly another embodiment of the sensor according to the invention.

FIG. 25 diagrammatically shows the electronic circuit MD of a current sensor according to the invention. This electronic circuit is e.g. associated with the magnetic circuit CM, the sample 2 and the coil 4, connected to the coaxial cable 78, which can be seen in FIG. 24. The electronic circuit shown in FIG. 25 corresponds to a variant of that of FIG. 12 or the circuit partly shown in FIG. 21.

The electronic circuit of FIG. 25 comprises the clock generator 54 supplying the signals ck,ck+,ck$-$ and cb.

FIG. 25 shows the high frequency generator 6 (radio frequency oscillator), which excites the resonance by means of the measuring bridge 8 and the coil 4. In FIG. 25 the box carrying the reference 79 symbolizes the tuning circuit (incorporating in FIG. 18 capacitors c1,c2 and c3, the resistor R1 and the diode D1 and in FIG. 21 the capacitors c2 and c3, the resistor R1 and the diode D1).

The generator 6 also controls the mixer 18 by means of the phase shifter 34, the output of the measuring bridge 8 reaching said mixer 18 through the amplifier 16 and the low-pass filter 20, receiving the signals from the mixer 18, as in the case of the magnetometer of FIG. 18.

Unlike in the case of FIG. 18, it is the output signal of the lowpass filter 20 and not the output signal of the mixer 18, which is successively processed by the sample and hold circuit 10a, controlled by the signal cb and by the integrator 10b connected to the tuning circuit.

In the circuit of FIG. 25 there is once again the device 36 receiving the output signal from the low-pass filter 20 and which is followed by the sample and hold circuit 38, in turn followed by the integrator 40. There is also a sample and hold circuit 80 receiving at the input the output signal from the low-pass filter, which is controlled by the signals ck and whose output is connected to the input of an integrator 82.

The circuit of FIG. 25 also comprises the device 50 of FIG. 18, whose input is connected to the output of the integrator 82.

Finally, the circuit of FIG. 25 comprises an adder 84, whose two inputs are respectively connected to the outputs of the integrator 40 and the device 50 and which supplies the coil 32 (FIG. 24) across a voltage-current converter 44a, e.g. a resistor.

The chronogram of the signals ck, ck+, ck− and cb used in the circuit of FIG. 25 is that of FIG. 19, the latter making it possible to understand the operation of the circuit of FIG. 25.

Figure 26:
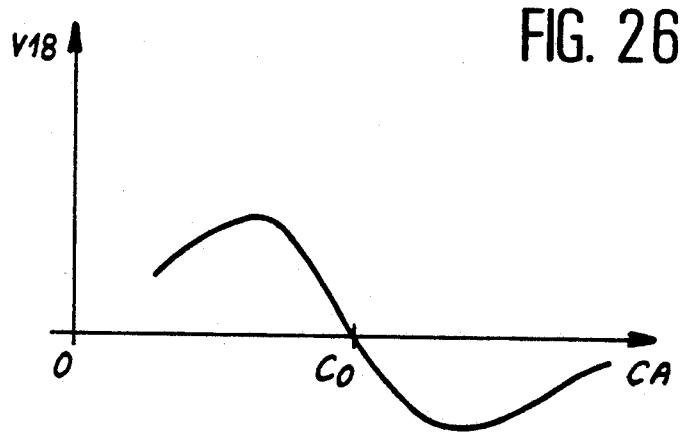
FIG. 26 variations of a tuning capacitance relative to the sensor of FIG. 25.

At the output of the balanced mixer 18, the effect of a variation of the tuning capacitance CA around the value Co corresponding to the resonance is shown in FIG. 26. The curve of the latter (in which V18 designates the output voltage of the mixer 18) is only valid if not disturbed by the resonance of the spins of the material of sample 2. To ensure this, the measurement is only performed outside resonance during the pulse cb when the polarization or bias field is zero and is stored during other times.

This sampled measurement gives access to the spectrum of the variations of CA around Co at all frequencies below half the sampling frequency. Therefore, this signal is used for making the capacitance dependent on the resonance value Co by the variable capacitance diode D1, which permits both an automatic tuning and a compensation of in particular thermal drifts.

This tuning loop of the resonant circuit is represented in FIG. 25 by the sample and hold circuit 10a, which is controlled by cb, and by the integrator 10b. In the circuit of FIG. 25, the polarization of the sample 2 is controlled by the loop, which comprises the sample and hold circuit 80, controlled by the signals ck, the integrator 82, the device 50 (switching of gain+1/−1) controlled by the signals ck+ and ck−, the adder 84 and the voltage-current converter 44a, which is connected to the coil 32 (field coil).

With the circuit of FIG. 25 the measurement of the current Im takes place by taking the value of the output voltage VM of the integrator 40. It is this voltage VM which controls the adder 84 and the voltage-current converter 44a in the feedback chain maintaining the magnetic field, level with the sample 2, opposite to the field created by the current to be measured IM, said feedback chain incorporating the device 36 (gain control+1/−1) controlled by the signals ck and ck−, the sample and hold circuit 38 and the integrator 40.

The circuit of FIG. 25 thus comprises three independent feedback loops:

a loop relative to the automatic control of the tuning of the resonant circuit at the frequency of the radio frequency oscillator 6, which has the advantage of eliminating disturbing drifts of the circuit, bringing about a voltage offset at the detection output, whilst also eliminating a capacitance regulation, a loop relative to the polarization of the sample 2 by a field Ho (satisfying the aforementioned Larmor relation), which has the advantage of eliminating the regulation of said polarization and the drift problems linked with a fixed polarization and a loop relative to the current to be measured, which has the advantage associated with this type of feedback, i.e. an improvement of the linearity and the dynamic range.

The magnetic circuit of a sensor according to the invention serves as a shield or screen relative to the terrestrial magnetic field.

Figure 27:
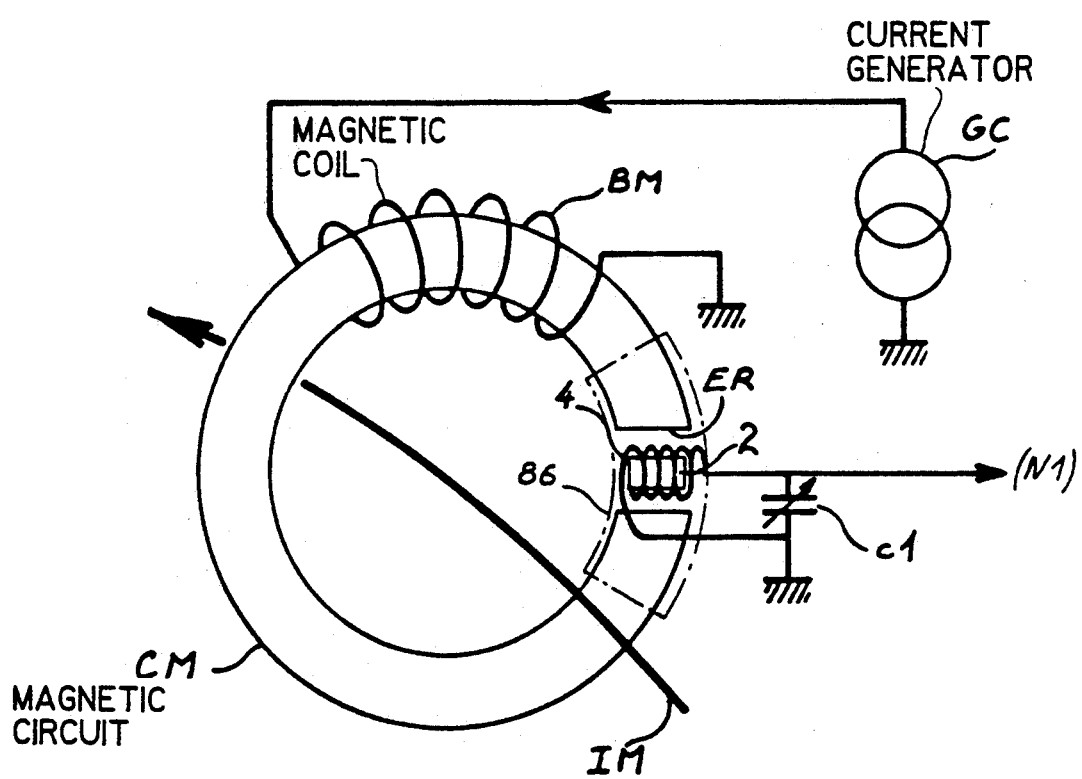
FIG. 27 diagrammatically a magnetic shield with respect to the terrestrial magnetic field and which can be used on a sensor according to the invention.

However, to further decrease the influence of said field and increase the accuracy of the measurements, it is possible to add to the magnetic circuit of a sensor according to the invention a tubular, e.g. Mumetal shield shown in FIG. 27. This shield 86 surrounds part of the magnetic circuit CM, where its gap is formed.

To measure the intensity of a current transported by a conductor using a sensor according to the invention, it is possible to break or cut the conductor, install the magnetic circuit of the sensor, so that-it surrounds the conductor, followed by the restoration of the conductor.

In more practical manner, it is possible to use a grip current tester adapted to the invention (replacement of the Hall cell of such a tester by a miniaturized field sensor-sample 2 and coil 4).

The means able to create the audio dither field, the polarization field and the feedback field can be constituted by the same coil, or two coils, or three coils placed in the gap or wound around the magnetic circuit.

We claim:

1. A current sensor comprising:
   a magnetic circuit having a magnetic loop interrupted by a gap, said magnetic loop surrounding a current to be measured;
   polarization means having a magnetic coil surrounding the magnetic loop, said polarization means being supplied by a polarization direct current for producing said polarization magnetic field; and
   a measuring device for supplying a voltage representative of a magnetic field Hlex produced in said gap by said current to be measured, said magnetic field Hlex having a value which is a function of the intensity of said current to be measured, wherein said measuring device is a resonance directional magnetometer including
   a sample placed in said gap which is made from a material having resonant spins and which is exposed to a polarization magnetic field generated by said polarization means parallel to said magnetic field Hlex produced in said gap, and
   measuring means comprising first magnetic means positioned in the vicinity of the sample for exciting a spin resonance of said sample and for detecting the excited spin resonance, and wherein said measuring means has a function for providing, an an output, said voltage representative of said magnetic field Hlex produced in said gap.

2. The current sensor according to claim 1, further comprising a direct current source for supplying the polarization direct current to said magnetic coil.

3. The current sensor according to claim 1, wherein said measuring means comprise electronic means for supplying the first magnetic means with an AC current whose frequency is close to the Larmor frequency and for supplying an output of said measuring means with said voltage representative of the magnetic field Hlex which has variations, as a function of the magnetic field applied to the sample, corresponding to a dispersion resonance curve of said sample.

4. The current sensor according to claim 1, wherein the measuring means further comprise electronic means for supplying said first magnetic means with an AC current which has a frequency close to the Larmor frequency, and feedback means for producing in the sample, by means of a second magnetic means, a compensation magnetic field for compensating the magnetic field Hlex produced in said gap and for supplying said voltage representative of the magnetic field Hlex, said electronic means supplying said feedback means with an error voltage $V_s$.

5. The current sensor according to claim 1, wherein the magnetic loop is a clip magnetic loop which is opened and closed around the current to be measured as in a grip current tester.

6. The current sensor according to claim 4, characterized in that the measuring means also incorporate processing means for producing a square-wave current producing, in the gap, a magnetic field pulsed between two values $$Ho-Hb+Hlex \text{ and } Hb-Ho+Hlex$$

in which Ho is the value and the magnetic field applied to the sample at resonance and Hb is the polarization magnetic field which is close to Ho, and that the second magnetic means receive said pulsed square-wave current.

7. The current sensor according to claim 6, characterized in that the feedback means incorporate an integrator, which is controlled by the processing means, and a voltage-current converter, whose input is connected to the output of the integrator and whose output supplies the second magnetic means.

8. The current sensor according to claim 6, characterized in that the processing means comprise:
electronic means for supplying the first magnetic means and for supplying at the output said error voltage, whose variations as a function of the magnetic field applied to the sample correspond to the dispersion curve of said sample,
a first electronic device connected to the output of the electronic means and permitting a voltage gain of alternately $+1-1$,
a sample and hold circuit, whose input is connected to the output of the first electronic device and whose output controls the feedback means,
a voltage source,
a second electronic device supplied by said source and permitting a voltage gain of alternately $+1$ and $-1$ and
another voltage-current converter, whose input is connected to the output of the second electronic device and which supplies the second magnetic means.

9. The current sensor according to claim 6, characterized in that the processing means comprise:
electronic means for supplying the first magnetic means and for supplying at the output, as result of a synchronous detection controlled by a voltage signal at an audio frequency, said error voltage whose variations as a function of the magnetic field applied to the sample correspond to the derivative of the absorption curve of said sample,
a first electronic device connected to the output of the electronic means and allowing a voltage gain of alternately $+1$ and $-1$,
a sample and hold circuit, whose input is connected to the output of the first electronic device and whose output controls the feedback means,
a voltage source,
a second electronic device supplied by said source and allowing a voltage gain of alternately $+1$ and $-1$ and
another voltage-current converter, whose input is connected to the output of the second electronic device and which supplies the second magnetic means.

10. The current sensor according to claim 6, characterized in that the processing means comprise:
electronic means for supplying the first magnetic means and for supplying at the output, as a result of a synchronous detection controlled by a voltage signal at an audio frequency, said error voltage, whose variations as a function of the magnetic field applied to the sample correspond to the derivative of the absorption curve of said sample,
a sample and hold circuit, whose input is connected to the output of the electronic means and whose output controls the feedback means,
a voltage source,
a summation means for supplying at the output a voltage signal equal to the sum of said voltage and a signal obtained from the synchronous detection at audio frequency,
an electronic device connected to the output of the summation means and allowing a voltage gain of alternately $+1$ and $-1$ and
another voltage-current converter, whose input is connected to the output of the electronic device and which supplies the second magnetic means.

11. The current sensor according to claim 6, characterized in that it also comprises means able to maintain respectively equal to Ho and $-$Ho the maximum and minimum values of the polarization field.

12. The current sensor according to claim 4, characterized in that the second magnetic means incorporate at least one magnetic coil wound around the magnetic circuit.

13. The current sensor according to claim 4, characterized in that the second magnetic means incorporate at least one magnetic coil placed in the gap and wound around the sample and whose axis is parallel to the magnetic field produced in the gap by the current to be measured.

14. The current sensor according to claim 1, characterized in that the measuring means incorporate a resonant circuit, which incorporates the first magnetic means and which is tuned to the frequency fo of the resonance, as well as means able to maintain the resonant circuit tuned to the frequency fo.

15. The current sensor according to claim 1, characterized in that it also comprises, around the first magnetic means and the sample, a protection means with respect to the terrestrial magnetic field.

16. The current sensor according to claim 1, characterized in that it also comprises, around the first magnetic means and the sample, a protection means relative to radio frequency electromagnetic fields.

* * * * *